(12) United States Patent
Tokuda et al.

(10) Patent No.: US 7,635,892 B2
(45) Date of Patent: Dec. 22, 2009

(54) SEMICONDUCTOR DEVICE

(75) Inventors: Norifumi Tokuda, Tokyo (JP); Shigeru Kusunoki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 257 days.

(21) Appl. No.: 11/561,823

(22) Filed: Nov. 20, 2006

(65) Prior Publication Data

US 2007/0075332 A1 Apr. 5, 2007

Related U.S. Application Data

(63) Continuation of application No. 10/505,179, filed as application No. PCT/JP03/08869 on Jul. 11, 2003, now abandoned.

(30) Foreign Application Priority Data

Jan. 20, 2003 (WO) .................. PCT/JP03/00443

(51) Int. Cl.
*H01L 29/76* (2006.01)
*H01L 29/94* (2006.01)
(52) U.S. Cl. .................. 257/328; 257/329; 257/496; 257/E27.091; 257/E29.118; 438/138
(58) Field of Classification Search .................. 257/496, 257/328, 330, 335, 618, 135, 138, 139, 262, 257/E27.091, E27.095, E27.096, E29.118; 438/138
See application file for complete search history.

(56) References Cited

U.S. PATENT DOCUMENTS

| | | | |
|---|---|---|---|
| 3,370,209 A | 2/1968 | Davis et al. | |
| 5,289,019 A * | 2/1994 | Terashima | 257/139 |
| 5,841,181 A | 11/1998 | Sakamoto | |
| 6,054,748 A * | 4/2000 | Tsukuda et al. | 257/496 |
| 6,404,032 B1 * | 6/2002 | Kitada et al. | 257/471 |
| 2002/0041003 A1 | 4/2002 | Udrea et al. | |

FOREIGN PATENT DOCUMENTS

| | | |
|---|---|---|
| EP | 0 368 246 A2 | 5/1990 |
| EP | 0 971 418 A2 | 1/2000 |
| JP | 4-192474 | 7/1992 |
| JP | 5-190831 | 7/1993 |
| JP | 05-190831 | 7/1993 |
| JP | 5-190835 | 7/1993 |

(Continued)

*Primary Examiner*—Theresa T Doan
(74) *Attorney, Agent, or Firm*—Oblon, Spivak, McClelland, Maier & Neustadt, L.L.P.

(57) ABSTRACT

A semiconductor device has a semiconductor substrate having a first main surface, a second main surface opposite to the first main surface, and a recess defined in the second main surface by side surfaces and a bottom surface, a semiconductor region provided in the bottom surface of the recess of the semiconductor substrate, semiconductor regions provided in the surface of a peripheral region on the second main surface side, and insulating films provided on the side surfaces of the recess to electrically insulate the semiconductor regions.

10 Claims, 21 Drawing Sheets

FOREIGN PATENT DOCUMENTS

| | | |
|---|---|---|
| JP | 6-21358 | 1/1994 |
| JP | 6-350109 | 12/1994 |
| JP | 8-213292 | 8/1996 |
| JP | 10-50724 | 2/1998 |
| JP | 11-31208 | 2/1999 |
| JP | 2000-40833 | 2/2000 |
| JP | 2000-260670 | 9/2000 |
| JP | 2001-44088 | 2/2001 |
| JP | 2002-16266 | 1/2002 |
| JP | 2002-76326 | 3/2002 |
| JP | 2002-170963 | 6/2002 |

\* cited by examiner

F I G . 9
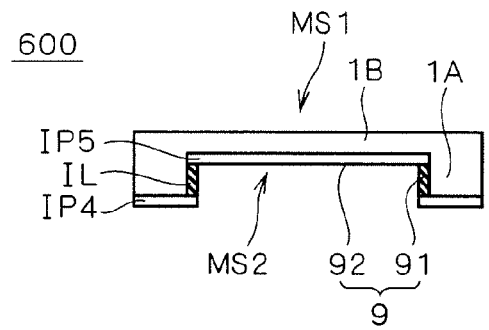
F I G . 1 0
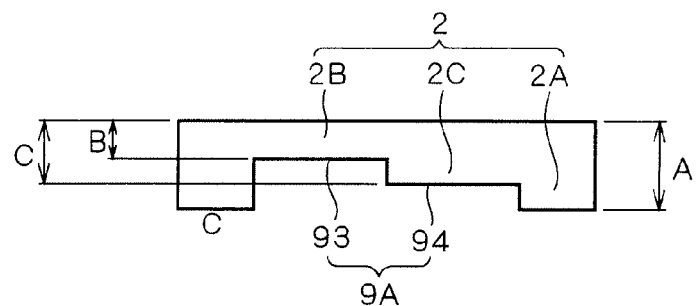
F I G . 1 1
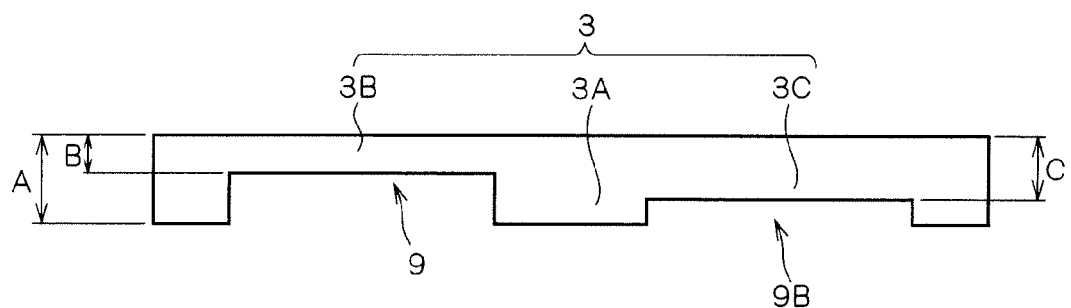

F I G . 1 2
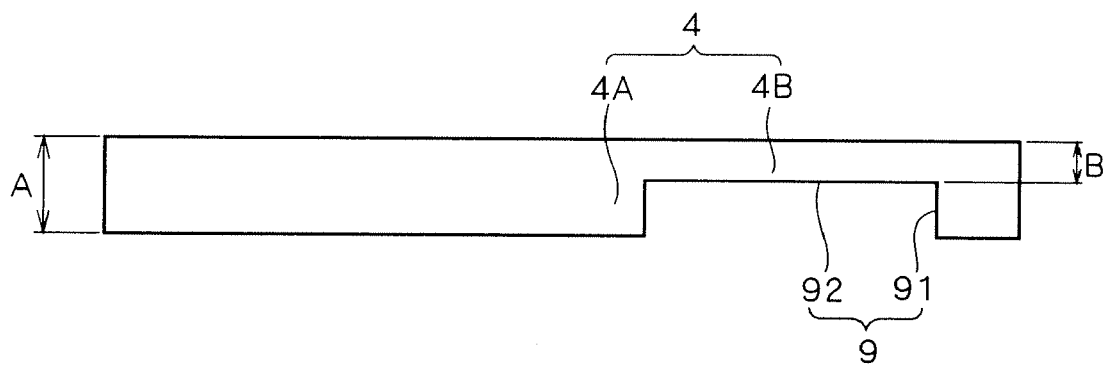
F I G . 1 3
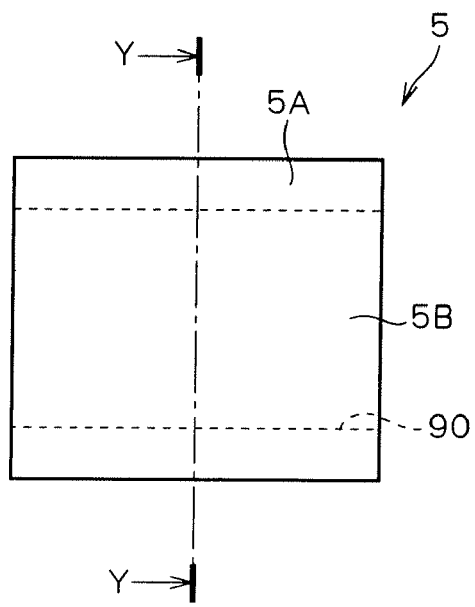

F I G . 2 2
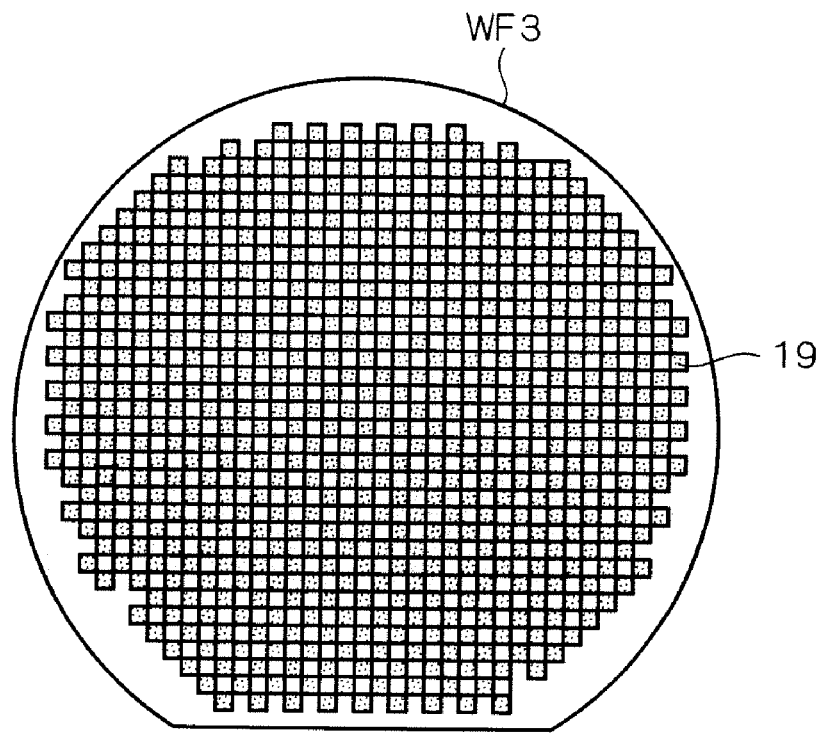
F I G . 2 3
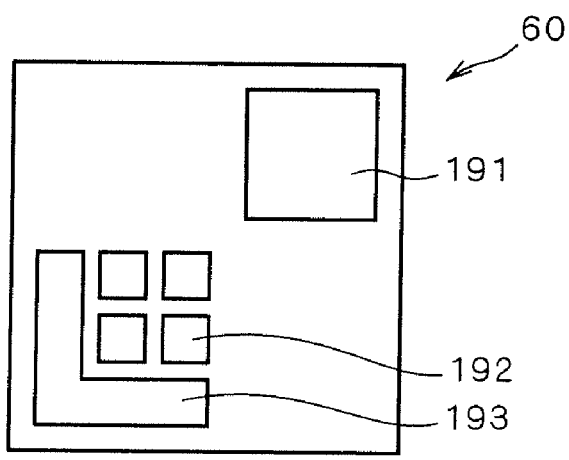

F I G . 2 6
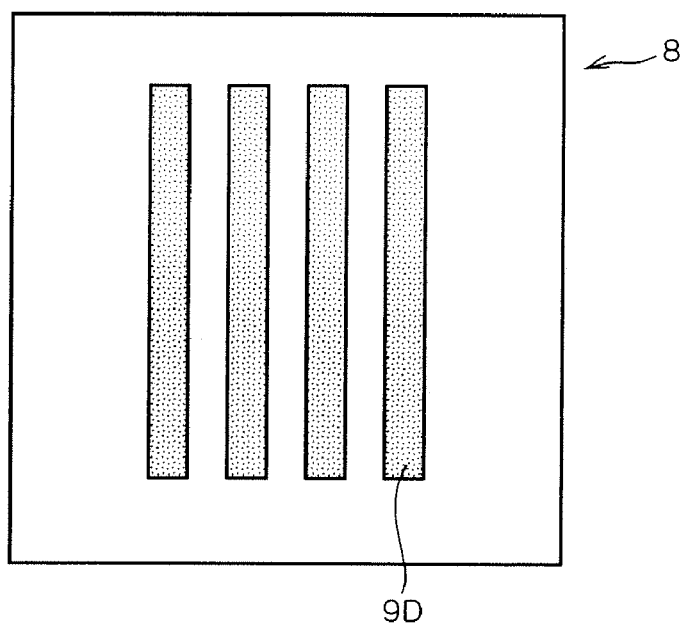
F I G . 2 7
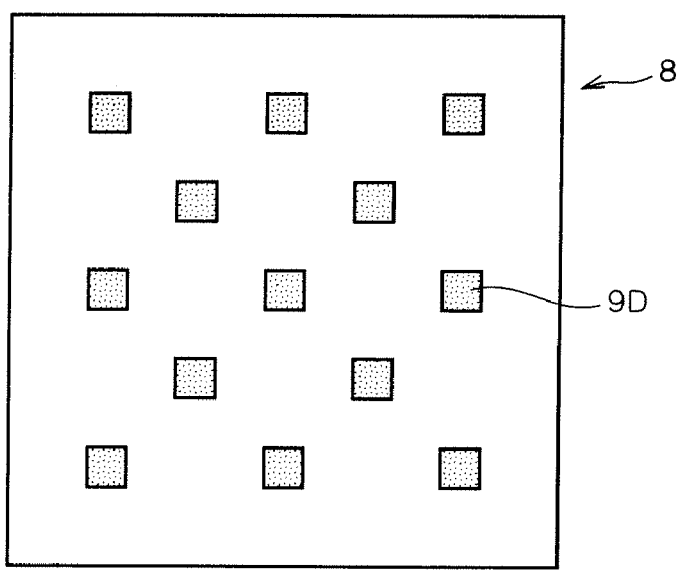

SEMICONDUCTOR DEVICE

TECHNICAL FIELD

This application is a continuation of and is based upon and claims the benefit of priority under 35 U.S.C. § 120 from U.S. Ser. No. 10/505,179, filed on Aug. 31, 2004, the entire contents of which are incorporated herein by reference.

BACKGROUND ART

In general, in a semiconductor device in which the main current flows in the direction of the thickness of the semiconductor substrate, the breakdown voltage increases as the semiconductor substrate thickness increases to a certain thickness determined by the resistivity of the substrate; the breakdown voltage becomes substantially fixed at the certain thickness or more. On the other hand, increasing the semiconductor substrate thickness increases the on-state resistance, which increases power dissipation and deteriorates performance.

Thus, with a semiconductor device in which the main current flows in the thickness direction of the semiconductor substrate, the optimum substrate thickness is determined in consideration of the balance between performance and breakdown voltage.

Also, in semiconductor device manufacturing, there is an optimum substrate thickness for preventing problems such as cracking, breaking and bowing of the semiconductor substrate during process steps.

For example, Japanese Patent Application Laid-Open No. 8-213292 (referred to as First Patent Document) discloses a structure for reducing the weight of a semiconductor wafer, where a plurality of recesses are formed on the back to reduce the weight without lowering the mechanical strength.

Also, Japanese Patent Application Laid-Open No. 4-192474 (referred to as Second Patent Document) discloses a structure for preventing unauthorized reading of the circuit pattern provided on a semiconductor chip, where a plurality of recesses are formed on the back of the semiconductor chip so that the semiconductor chip easily breaks when subjected to unauthorized reading.

There is an optimum substrate thickness also from the viewpoint of photolithography process, since, if the semiconductor substrate is extremely thin, then existing exposure systems etc. need focal depth control during formation of a given pattern by photolithography on the semiconductor substrate, causing great inconvenience.

Thus, in semiconductor devices in which the main current flows in the thickness direction of the semiconductor substrate, determining the substrate thickness requires considering not only the performance and breakdown voltage but also the mechanical strength of the semiconductor substrate and the photolithography processing conditions. Use of epitaxial-growth substrates is proposed in order to satisfy these conditions, but thickening epitaxial-growth layers takes time and increases cost.

DISCLOSURE OF THE INVENTION

An object of the invention is to provide a semiconductor device in which a main current flows in the thickness direction of the semiconductor substrate and which offers satisfactory performance and breakdown voltage and also satisfactory mechanical strength of the semiconductor substrate, and which needs no inconvenient control of the exposure system etc. during photolithography process.

According to a first aspect of the invention, in a semiconductor device including a first main electrode provided on a first main surface of a semiconductor substrate and a second main electrode provided on a second main surface of said semiconductor substrate and wherein a main current flows in a thickness direction of said semiconductor substrate, said semiconductor substrate has at least one recess formed in said second main surface and therefore at least has a first region having a first thickness and a second region having a second thickness smaller than said first thickness, said second region corresponds to a region where said at least one recess is formed, said second main electrode is provided in said recess, and said second thickness is set at such a thickness as to satisfy the breakdown voltage of said semiconductor device.

According to the first aspect of the semiconductor device of the invention, the first thickness, for example, can be set so that the semiconductor wafer is less likely to crack or break during manufacturing and so that no special focal depth control is needed for the exposure system etc.; this reduces occurrence of defects during manufacturing and reduces the manufacturing cost, and offers a semiconductor device achieving a balance between the reduction of on-state resistance and the sustainment of breakdown voltage.

According to a second aspect of the invention, in a semiconductor device including a first main electrode provided on a first main surface of a semiconductor substrate and a second main electrode provided on a second main surface of said semiconductor substrate and wherein a main current flows in a thickness direction of said semiconductor substrate, said semiconductor substrate has at least one recess formed in said second main surface and therefore at least has a first region having a first thickness and a second region having a second thickness smaller than said first thickness, and wherein said second thickness is set at such a thickness as to keep a breakdown voltage of said semiconductor device, said second region corresponds to a region where said at least one recess is formed, said at least one recess is filled with a conductor layer, and said second main electrode is provided on a surface of said conductor layer.

According to the second aspect of the semiconductor device of the invention, the first thickness, for example, can be set so that the semiconductor wafer is less likely to crack or break during manufacturing and so that no special focal depth control is needed for the exposure system etc.; this reduces occurrence of defects during manufacturing and reduces the manufacturing cost, and offers a semiconductor device achieving a balance between reducing the on-state resistance and keeping the breakdown voltage. Furthermore, filling the at least one recess with a conductor layer enhances the mechanical strength of the semiconductor substrate and facilitates handling of the semiconductor substrate during semiconductor device manufacturing process.

Objects, features, aspects and advantages of the present invention will become more apparent from the following detailed description of the present invention and the accompanying drawings.

BRIEF DESCRIPTION OF THE DRAWINGS

FIG. 9 is a cross-sectional view showing the structure of a semiconductor device of a sixth preferred embodiment of the invention;

FIG. 10 is a cross-sectional view showing another example of structure of the semiconductor substrate for a semiconductor device of the invention;

FIG. 11 is a cross-sectional view showing another example of structure of the semiconductor substrate for a semiconductor device of the invention;

FIG. 12 is a cross-sectional view showing another example of structure of the semiconductor substrate for a semiconductor device of the invention;

FIG. 13 is a plan view showing the structure of a semiconductor substrate used to manufacture a semiconductor device of the invention;

FIG. 22 is a plan view showing the structure of a wafer of semiconductor substrates having a plurality of recesses;

FIG. 23 is a plan view showing the structure of a semiconductor substrate having a plurality of recesses;

FIG. 26 is a plan view showing the structure of a semiconductor substrate used to manufacture a semiconductor device of the invention;

FIG. 27 is a plan view showing the structure of a semiconductor substrate used to manufacture a semiconductor device of the invention;

BEST MODE FOR IMPLEMENTING THE INVENTION

Figure 1:
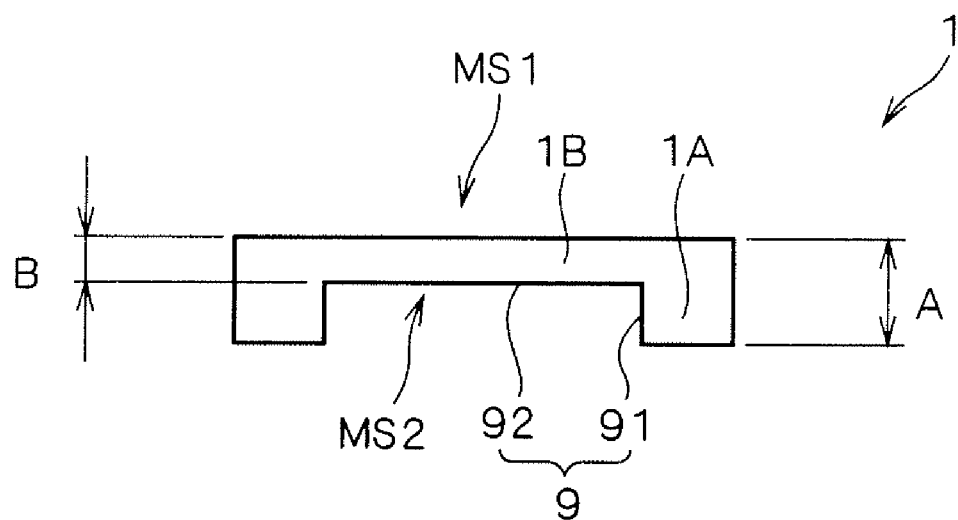
FIG. 1 is a cross-sectional view showing the structure of a semiconductor substrate used to manufacture a semiconductor device of the present invention.
Figure 2:
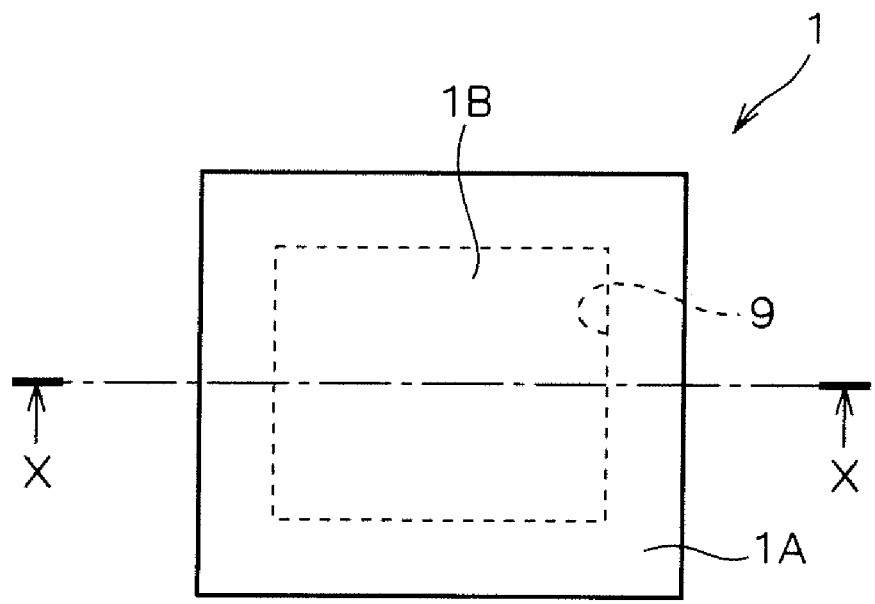
FIG. 2 is a plan view of the semiconductor substrate for a semiconductor device of the present invention.
Figure 3:
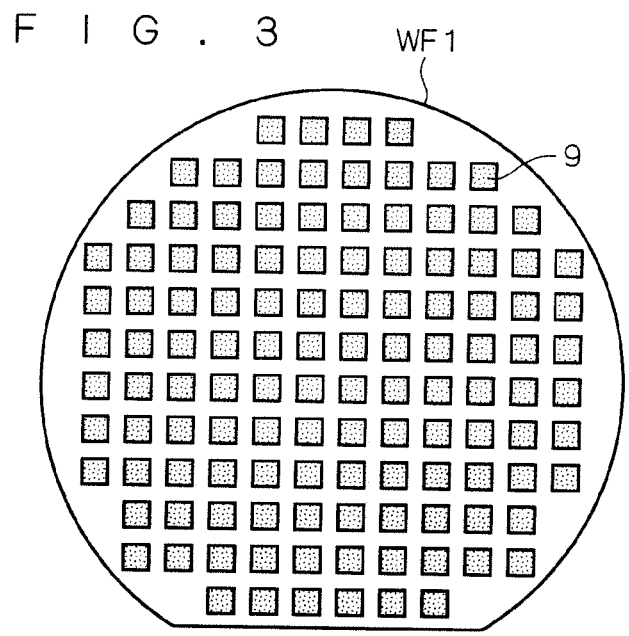
FIG. 3 is a plan view showing the structure of a wafer of semiconductor substrates for semiconductor devices of the invention.

Before describing the preferred embodiments of the invention, the structure of a semiconductor substrate that is common to the preferred embodiments is now described referring to FIGS. 1 to 3.

FIG. 1 is a cross-sectional view of a semiconductor substrate 1 used in common in the preferred embodiments.

The semiconductor substrate 1 shown in FIG. 1 has a first main surface MS1, a second main surface MS2 on the opposite side, and a recess 9 defined in the second main surface MS2 by side surfaces 91 and a bottom surface 92. With the recess 9, the semiconductor substrate 1 has a peripheral region 1A (first region) with a thickness A and a central region 1B (second region) with a thickness B which is smaller than the thickness A.

That is to say, the vertical thickness from the bottom surface 92 of the recess 9 to the first main surface MS1 is the thickness B which is smaller than the thickness A.

The thickness A is set so that the semiconductor wafer will not break or crack during the semiconductor device manufacturing process and so that the photolithography process needs no special focal depth control of the exposure system etc. For example, it is set at 500-650 μm with a 6-inch semiconductor wafer.

The thickness B is determined in consideration of the reduction of on-state resistance and the requirement of breakdown voltage; for example, it is set at 60 μm with a semiconductor device having a breakdown voltage of 600 V.

FIG. 2 is a plan view of the semiconductor substrate 1 seen from the first main surface MS1 side. As shown in FIG. 2, the recess 9 is located substantially in the center of the semiconductor substrate 1 and has a rectangular shape in plan view. The area around the recess 9 forms the peripheral region 1A with the thickness A. The cross-section along line X-X seen in the arrow direction in FIG. 2 corresponds to FIG. 1. The recess 9 may of course be circular or oval, or more complicatedly shaped, in plan view.

Although the semiconductor substrate 1 shown in FIGS. 1 and 2 is a semiconductor substrate processed into a semiconductor chip, the formation of the recess 9 is performed as a wafer processing step with a semiconductor wafer. FIG. 3 shows recesses 9 corresponding to individual chips in a semiconductor wafer WF1, where a plurality of recesses 9 are disposed in a matrix on one main surface of the semiconductor wafer WF1. This semiconductor wafer WF1 is diced along given dicing lines to obtain a plurality of semiconductor substrates 1.

A semiconductor device in which the main current flows in the thickness direction is manufactured using the semiconductor substrate 1 having regions with different thicknesses, which provides a first effect that the semiconductor wafer is less likely to break or crack, no special focal depth control is needed for the exposure system etc., and that the semiconductor device offers a good balance between the reduction of on-state resistance and the keeping of breakdown voltage.

Also, on the semiconductor wafer WF1, as shown in FIG. 3, the individual thinner regions have smaller areas relative to the total wafer area, which suppresses bowing of the thinner regions. Even if the semiconductor chips bow, they bow similarly because all semiconductor chip regions have the same structure, which provides a second effect of reducing characteristic variations among the semiconductor chips.

Also, with IGBTs (Insulated Gate Bipolar Transistors), for example, the parts relevant to the IGBT characteristics can be formed in the thinner central regions 1B so that the radiation energy of the energy beam (electron beam, ion beam, etc.) radiated for carrier lifetime control can be reduced. This provides a third effect that the formation depth of the lifetime control region can be more precise to enable lifetime control region formation with a smaller distribution width, so as to provide semiconductor devices with reduced characteristic variations.

Now, the structures of semiconductor devices manufactured using the semiconductor substrate 1 will be described as first to sixth preferred embodiments of the invention.

A. First Preferred Embodiment

Figure 4:
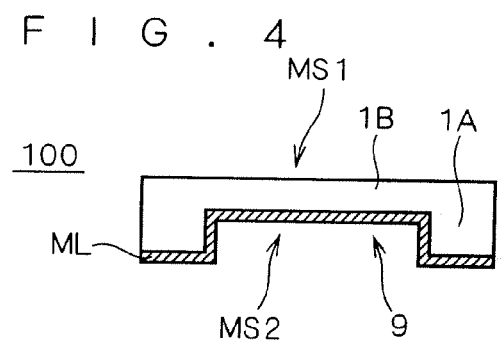
FIG. 4 is a cross-sectional view showing the structure of a semiconductor device of a first preferred embodiment of the invention.

FIG. 4 shows the structure of a semiconductor device 100 according to a first preferred embodiment. As shown in FIG. 4, the semiconductor device 100 has the semiconductor substrate 1 described with FIG. 1 and an electrode ML; the electrode ML is provided all over the second main surface MS2 including the side walls 91 and the bottom surface 92 of the recess 9 in the semiconductor substrate 1 and is made of a material that makes ohmic contact (or Schottky contact) with the semiconductor substrate 1.

When the semiconductor substrate 1 is made of silicon, the ohmic-contact material can be aluminum (Al) or an aluminum alloy.

Also, when the semiconductor substrate 1 is made of silicon, the Schottky-contact material can be titanium (Ti), hafnium (Hf), nickel (Ni), or tungsten (W), for example.

With ohmic contact, no barrier is formed at the junction between the metal and semiconductor layer, so that current can flow in both directions. On the other hand, with Schottky contact, a barrier is formed at the junction between the metal and semiconductor layer, so that current can flow only in one direction but not in the opposite direction. Therefore Schottky contact can itself constitute a diode (Schottky diode).

Now, when the electrode ML on the second main surface of the semiconductor substrate 1, where the recess 9 is formed, is made of a material that makes ohmic contact, then an IGBT using the ohmic electrode as its collector electrode, or a diode using the ohmic electrode as its anode, can be formed to achieve a reduction of the element resistance in the current flowing state, which structure is suitable for relatively low operating frequency devices.

Also, when the electrode ML is made of a material that makes Schottky contact, then an IGBT using the Schottky electrode as its collector electrode, or a diode using the Schottky electrode as its anode electrode, can be formed to obtain an element with reduced power dissipation at switching, which structure is suitable for relatively high operating frequency devices.

Needless to say, the use of the semiconductor substrate 1 provides the first to third effects described earlier.

B. Second Preferred Embodiment

Figure 5:
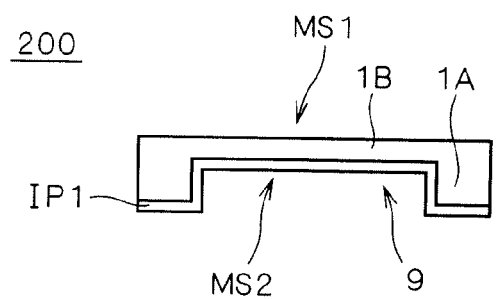
FIG. 5 is a cross-sectional view showing the structure of a semiconductor device of a second preferred embodiment of the invention.

FIG. 5 shows the structure of a semiconductor device 200 according to a second preferred embodiment. As shown in FIG. 5, the semiconductor device 200 has the semiconductor substrate 1 described with FIG. 1 and a semiconductor region IP1 provided in the entire second main surface MS2 including the surface of the recess 9 of the semiconductor substrate 1.

The impurity concentration of the semiconductor region IP1 is set higher than the impurity concentration of the semiconductor substrate 1.

For example, when the impurity concentration of the semiconductor substrate 1 is $1 \times 10^{13}/cm^3$ to $1 \times 10^{15}/cm^3$, then the impurity concentration of the semiconductor region IP1 is set at $1 \times 10^{20}/cm^3$ or higher.

Thus forming the high-concentration semiconductor region IP1 in the second main surface MS2 having the recess 9 thins the Schottky barrier so as to make the second main surface MS2 suitable for ohmic contact.

Thus, IGBTs, diodes, and MOSFETs (MOS field effect transistors) with excellent operating characteristics can be obtained by forming electrodes relevant to characteristics of the elements, i.e. anodes, cathodes, collectors, drains, etc., in the central region 1B having the thickness B determined in consideration of on-state resistance reduction and breakdown voltage.

Needless to say, the use of the semiconductor substrate 1 provides the first to third effects described earlier.

C. Third Preferred Embodiment

Figure 6:
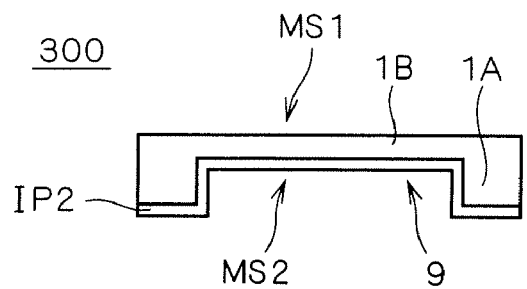
FIG. 6 is a cross-sectional view showing the structure of a semiconductor device of a third preferred embodiment of the invention.

FIG. 6 shows the structure of a semiconductor device 300 according to a third preferred embodiment. As shown in FIG. 6, the semiconductor device 300 has the semiconductor substrate 1 described with FIG. 1 and a semiconductor region IP2 provided in the entire second main surface MS2 including the surface of the recess 9 of the semiconductor substrate 1.

The impurity conductivity type of the semiconductor region IP2 is set opposite to the impurity conductivity type of the semiconductor substrate 1.

For example, when the impurity conductivity type of the semiconductor substrate 1 is N type, then the impurity conductivity type of the semiconductor region IP2 is P type. This provides a diode in which the second main surface MS2 side works as the anode.

Reversing the impurity conductivity type of the semiconductor substrate 1 and that of the semiconductor region IP2 provides a diode in which the second main surface MS2 side works as the cathode.

Needless to say, the use of the semiconductor substrate 1 provides the first and second effects described earlier.

D. Fourth Preferred Embodiment

Figure 7:
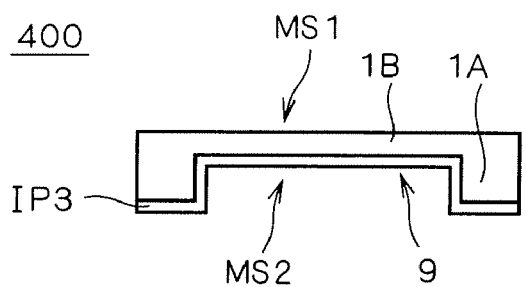
FIG. 7 is a cross-sectional view showing the structure of a semiconductor device of a fourth preferred embodiment of the invention.

FIG. 7 shows the structure of a semiconductor device 400 according to a fourth preferred embodiment. As shown in FIG. 7, the semiconductor device 400 has the semiconductor substrate 1 described referring to FIG. 1 and a semiconductor region IP3 provided in the entire second main surface MS2 including the surface of the recess 9 of the semiconductor substrate 1.

The impurity conductivity type of the semiconductor region IP3 is the same as the impurity conductivity type of the semiconductor substrate 1.

For example, when the impurity conductivity type of the semiconductor substrate 1 is N type, then the impurity conductivity type of the semiconductor region IP3 is N type. Then, by forming a P-type semiconductor region (not shown) on the first main surface MS1 side, a diode having the second main surface MS2 as the cathode can be obtained.

As explained in the second preferred embodiment described referring to FIG. 5, the second main surface MS2 can be made suitable for ohmic contact by setting the impurity concentration of the semiconductor region IP3 higher than that of the semiconductor substrate 1.

Needless to say, the use of the semiconductor substrate 1 provides the first and second effects described earlier.

E. Fifth Preferred Embodiment

Figure 8:
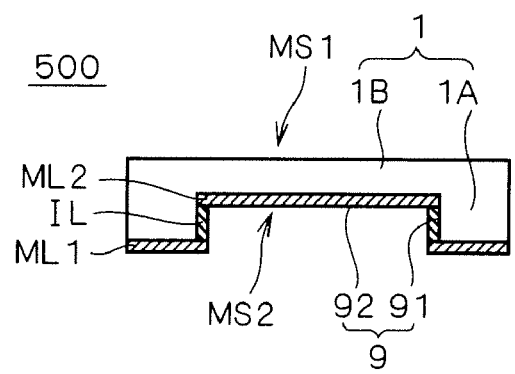
FIG. 8 is a cross-sectional view showing the structure of a semiconductor device of a fifth preferred embodiment of the invention.

FIG. 8 shows the structure of a semiconductor device 500 according to a fifth preferred embodiment. As shown in FIG. 8, the semiconductor device 500 has the semiconductor substrate 1 described with FIG. 1, an electrode ML2 provided on the bottom surface 92 of the recess 9 of the semiconductor substrate 1, electrodes ML1 provided on the peripheral region 1A on the second main surface MS2 side, and insulating films IL provided on the side walls 91 of the recess 9, for electrically insulating the electrodes ML1 and ML2.

Thus, by electrically insulating the electrode ML2 on the bottom surface 92 of the recess 9 and the electrodes ML1 on the peripheral region 1A of the second main surface MS2, it is possible to form semiconductor elements having different functions and characteristics in the peripheral region 1A and in the central region 1B that has the thickness B determined in consideration of on-state resistance reduction and breakdown voltage.

F. Sixth Preferred Embodiment

FIG. 9 shows the structure of a semiconductor device 600 according to a sixth preferred embodiment. As shown in FIG. 9, the semiconductor device 600 has the semiconductor substrate 1 described with FIG. 1, a semiconductor region IP5 provided in the surface of the bottom 92 of the recess 9 of the semiconductor substrate 1, semiconductor regions IP4 provided in the surface of the peripheral region 1A on the second main surface MS2 side, and insulating films IL provided on the side walls 91 of the recess 9, for electrically insulating the semiconductor regions LP4 and IP5.

Thus, by electrically insulating the semiconductor region IP5 in the surface of the bottom 92 of the recess 9 and the semiconductor regions IP4 in the surface of the peripheral region 1A of the second main surface MS2, it is possible to form plural kinds of semiconductor elements having different functions and characteristics in the peripheral region 1A and in the central region 1B that has the thickness B determined by considering on-state resistance reduction and breakdown voltage.

For example, with a high-resistance N-type substrate used as the semiconductor substrate 1, a control electrode and a first main electrode are formed on the first main surface MS1 and an N-channel MOS transistor is formed on the first main surface MS1 side. And the semiconductor region IP5 in the surface of the bottom 92 of the recess 9 is formed as a P-type semiconductor region and the semiconductor regions IP4 in the surface of the peripheral region 1A are formed as N-type semiconductor regions, and second main electrodes are formed respectively on the semiconductor regions IP4 and IP5.

Then the P-type semiconductor region IP5, the N-type semiconductor substrate 1, and the N-channel MOS transistor form an IGBT, and the N-type semiconductor regions IP4, the N-type semiconductor substrate 1, and the P-type semiconductor region forming the N-channel MOS transistor form a diode.

The IGBT and diode operate in a complementary manner when the potential applied to the first and second main electrodes is varied, forming a half bridge.

While the second main electrodes on the semiconductor regions IP4 and IP5 operate respectively as the cathode and collector electrodes, the area ratio between the cathode and collector electrodes can be varied by varying the area of the recess 9.

An energy beam (electron beam, ion beam, etc.) for carrier lifetime control can be applied to the peripheral region 1A from the second main surface MS2 side to form a lifetime control region, so as to effect lifetime control only in the peripheral region 1A. It is then possible to reduce the recovery of the diode without deteriorating IGBT operation.

A more specific structure of the semiconductor device 600 will be described later in a seventh preferred embodiment.

G. Other Examples of Structure of the Semiconductor Substrate

While the first to sixth preferred embodiments have been described assuming the use of the semiconductor substrate 1 having two different thicknesses as shown in FIG. 1, the structure of a substrate having regions with different thicknesses is not limited to that of FIG. 1.

For example, a substrate having three kinds of thicknesses, like the semiconductor substrate 2 of FIG. 10, may be used. That is to say, on the second main surface MS2 opposite to the first main surface MS1, it has a two-stepped recess 9A having bottom surfaces 93 and 94 at different depths. Thus the semiconductor substrate 2 has a peripheral region 2A (first region) with a thickness A, a first central region 2B (second region) with a thickness B, and a second central region 2C with a thickness C.

That is to say, the thickness A of the peripheral region 2A is the thickest, and the vertical thickness from the bottom surface 93 of the recess 9A to the first main surface MS1 is the thinnest thickness B, and the vertical thickness from the bottom surface 94 of the recess 9A to the first main surface MS1 is the thickness C, where the thickness C is intermediate between the thickness A and thickness B.

For example, with a 6-inch semiconductor wafer like the semiconductor substrate 1, the thickness A and the thickness B are set respectively at 500 to 650 μm and 60 μm, and with a semiconductor device with a breakdown voltage of 1200 V, the thickness C is set at 120 μm.

The recess 9A thus has the bottom surfaces 93 and 94 at different depths and hence the semiconductor substrate 2 has three kinds of thicknesses, which enables formation of more kinds of semiconductor elements.

Three kinds of thicknesses may be formed as shown with the semiconductor substrate 3 of FIG. 11. That is to say, it has recesses 9 and 9B at different depths in the second main surface MS2 opposite to the first main surface MS 1. Thus the semiconductor substrate 3 has a peripheral region 3A (first region) with a thickness A, a thinnest region 3B (second region) with a thickness B that corresponds to the recess 9, and an intermediate thickness region 3C with a thickness C that corresponds to the recess 9B. The dimensional relation among the thicknesses A, B and C is set like that of the semiconductor substrate 2.

While semiconductor substrates having three kinds of thicknesses have been described above, the thickness is not limited to three kinds; semiconductor substrates having three or more kinds of thicknesses can be obtained by forming a multi-stepped recess or a plurality of recesses with different depths.

Also, the structure of a semiconductor substrate having two kinds of thicknesses is not limited to that of the semiconductor substrate 1 of FIG. 1; the structure may be like that shown in FIG. 12.

That is to say, the semiconductor substrate 4 shown in FIG. 12 has a recess 9 formed in one side area of the second main surface MS2 and it thus has a thinnest region 4B (second region) having a thickness B that corresponds to the recess 9 and a peripheral region 4A (first region) having a thickness A around the first region 4B. The side area opposite to the side area where the recess 9 is formed has no recess and therefore it forms a uniform thickness region 4C (first region) having the single thickness A.

The semiconductor substrate 4 thus structured allows formation of plural kinds of semiconductor elements having different functions and characteristics; in the thinnest region 4B and peripheral region 4A, a semiconductor device in which the main current flows in the substrate thickness direction can be formed as in the semiconductor substrate 1, and a semiconductor device in which the main current flows in the substrate plane direction can be formed in the single-thickness region 4C.

As shown in FIG. 2, the recess 9 of the semiconductor substrate 1 is rectangular-shaped in plan view, surrounded by the peripheral region 1A; however, it may be shaped like a stripe as shown in FIG. 13. That is to say, the semiconductor substrate 5 shown in FIG. 13 has peripheral regions 5A (first region) only along its two parallel sides and a central region 5B (second region) between the peripheral regions 5A: the central region 5B corresponds to a recess 90 shaped like a stripe. The cross-section taken along line Y-Y in FIG. 13, seen from the direction of arrows, corresponds to FIG. 1.

When the recess 9 is surrounded by the peripheral region 1A as in the semiconductor substrate 1 or when the peripheral regions 5A are located on both sides of the recess 90 as in the semiconductor substrate 5, the recess 9 or recess 90 is located substantially in the center of the substrate. Therefore, when the semiconductor substrate is processed to produce a semiconductor chip, the semiconductor chip can be placed horizontally on the die pad during die bonding. That is to say, the peripheral regions on the four sides or two parallel sides come in contact with the die pad so that the semiconductor chip is not inclined with respect to the die pad. Thus, during interconnecting process by wire-bonding, the wires and semiconductor chips can always be bonded at the same angle, enabling uniform wire bonding. This prevents current convergence due to non-uniform contact resistance in the bonded parts.

Figure 14:
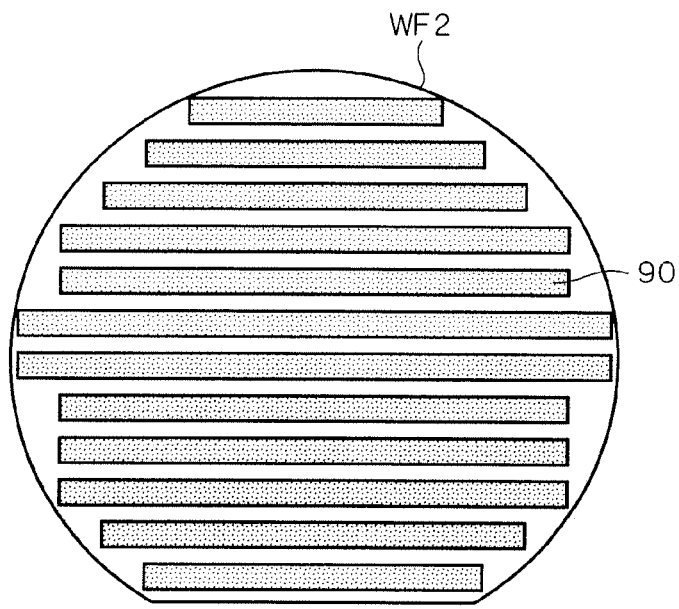
FIG. 14 is a plan view showing the structure of a wafer of semiconductor substrates for semiconductor devices of the invention.

FIG. 14 is a plan view of a semiconductor wafer for obtaining semiconductor substrates 5 of FIG. 13. FIG. 14 shows a semiconductor wafer WF2 with stripe-like recesses 90; a plurality of stripe-shaped recesses 90 are arranged in parallel on one main surface of the semiconductor wafer WF2.

The semiconductor wafer WF2 can be diced along given dicing lines to obtain a plurality of semiconductor substrates 5.

H. Relation between Dicing Lines and Recesses

After the manufacturing process (wafer process) to the semiconductor wafer, the semiconductor devices 100 to 600 described in the first to sixth preferred embodiments are separated along given dicing lines into individual chips.

Figure 15:
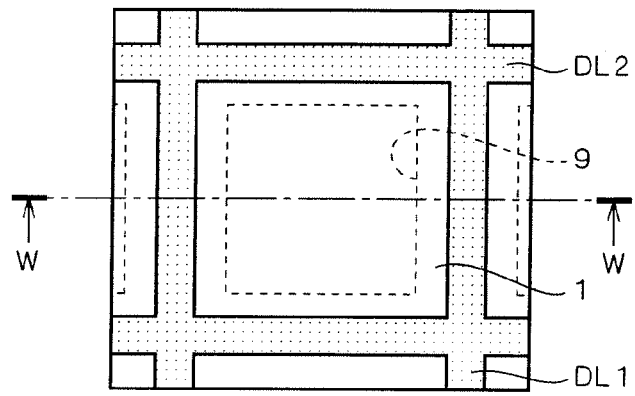
FIG. 15 is a plan view showing the positioning of dicing lines.

For example, with the semiconductor substrate 1 shown in FIGS. 1 and 2, the dicing lines and semiconductor substrates 1 are positioned as shown in FIG. 15.

That is to say, a semiconductor substrate 1 is surrounded by vertical dicing lines DL1 and horizontal dicing lines DL2.

Figure 16:
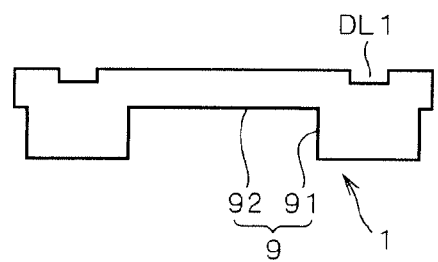
FIG. 16 is a cross-sectional view showing the positioning of the dicing lines.

FIG. 16 shows the cross-section taken along line W-W in FIG. 15. As shown in FIG. 16, the areas where the dicing lines DL1 and DL2 are located have the thickness A; during dicing, this prevents the semiconductor substrate 1 from warping when hit by the edge of a dicer, thereby preventing the semiconductor substrate 1 from being damaged and the dicing lines from being bent.

Figure 17:
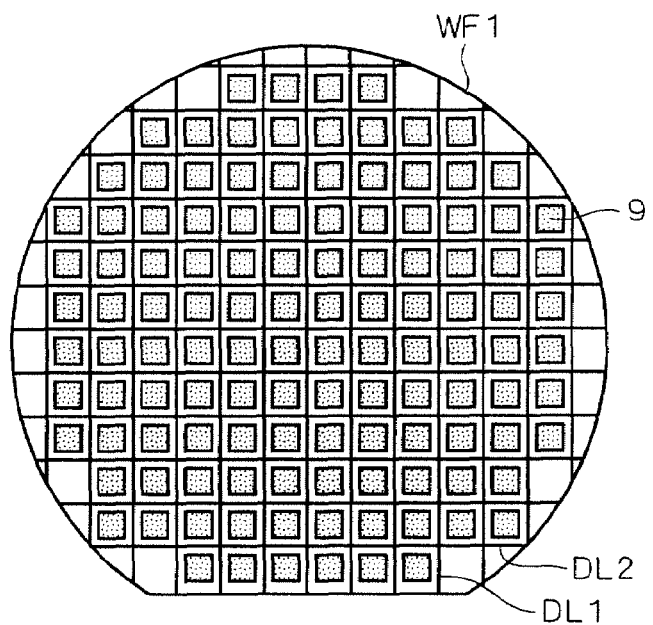
FIG. 17 is a plan view showing the structure of a semiconductor wafer on which dicing lines are positioned.

FIG. 17 is a plan view showing the semiconductor wafer WF1 for obtaining the semiconductor substrates 1 together with the dicing lines DL1 and DL2 disposed thereon.

Figure 18:
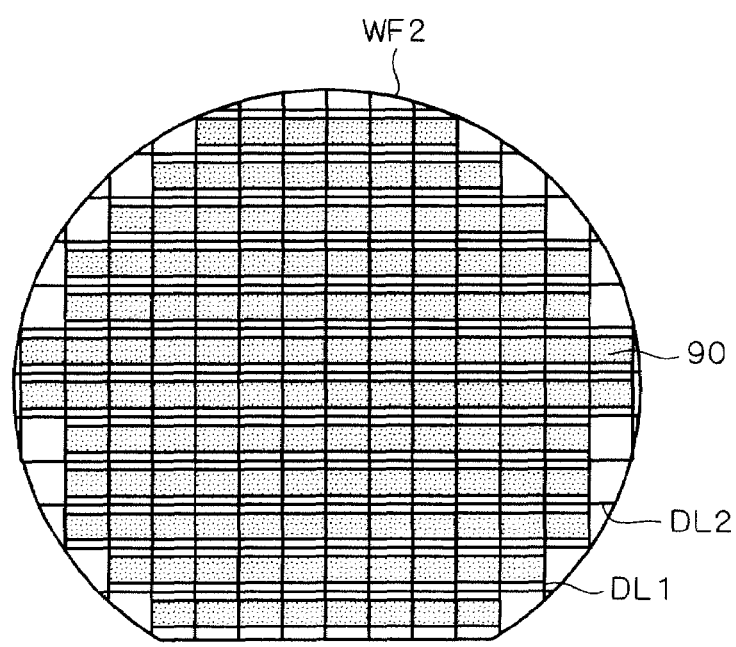
FIG. 18 is a plan view showing the structure of a semiconductor wafer on which dicing lines are positioned.

FIG. 18 is a plan view showing the semiconductor wafer WF2 for obtaining the semiconductor substrates 5 together with the dicing lines DL1 and DL2 disposed thereon.

On the semiconductor wafer WF2 of FIG. 18, the vertical dicing lines DL2 extend over the stripe-shaped recesses 90 and therefore cut thinner portions, but the semiconductor substrate 1 will not warp while being diced because both sides of the recesses 90 form the thick peripheral regions IA as mentioned earlier.

I. Relation Between Field Contact Rings and Recesses

The semiconductor devices 100 to 600 of the first to sixth preferred embodiments have not specifically shown the structure of the first main surface; with high-voltage semiconductor devices, field contact rings (also called field limiting rings) are often formed in the first main surface in order to relax electric fields in the peripheral area of the semiconductor chip.

Field contact rings contain impurities of a conductivity type opposite to that of the substrate to form junctions with the substrate; they are desirably formed in thicker areas to relax electric fields nearly along the substrate shape, and thinned areas where recesses are formed are not always appropriate for field contact rings.

Figure 19:
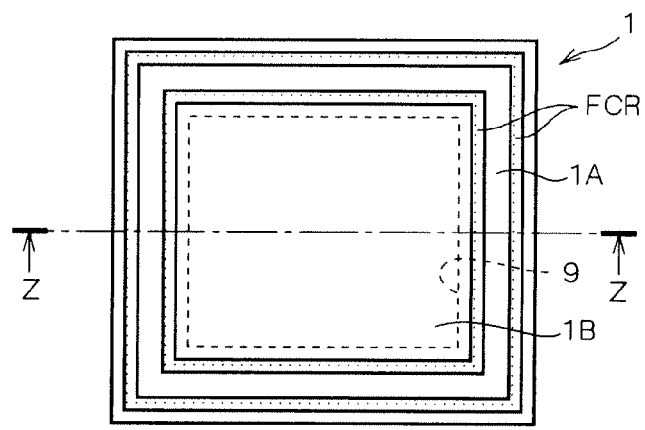
FIG. 19 is a plan view showing the positioning of field contact rings.

Accordingly, field contact rings FCR may be provided as shown in FIG. 19 in the peripheral region 1A surrounding the recess 9 to effectively alleviate electric fields vertical to the substrate main surface.

Figure 20:
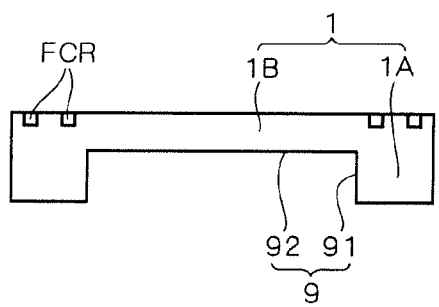
FIG. 20 is a cross-sectional view showing the positioning of the field contact rings.

FIG. 20 shows the cross-section along line Z-Z in FIG. 19. As shown in FIG. 20, a sufficient thickness is ensured under the field contact rings FCR to allow a margin for transient extension of depletion layers.

It is not impossible to provide field contact rings FCR in the semiconductor substrate 5 having the stripe-shaped recess 90 shown in FIG. 13. That is to say, field contact rings FCR can be formed as long as the thickness B of the central region 5B, corresponding to the recess 90, is larger than the depth of the field contact rings FCR and therefore field contact rings FCR may be formed not only in the peripheral regions 5A of the semiconductor substrate 5 but also across the central region 5B.

Although FIG. 19 shows filed contact rings FCR surrounding just a single recess 9, they may be formed also in substrates having a plurality of recesses, like the semiconductor substrate 3 shown in FIG. 11.

Figure 21:
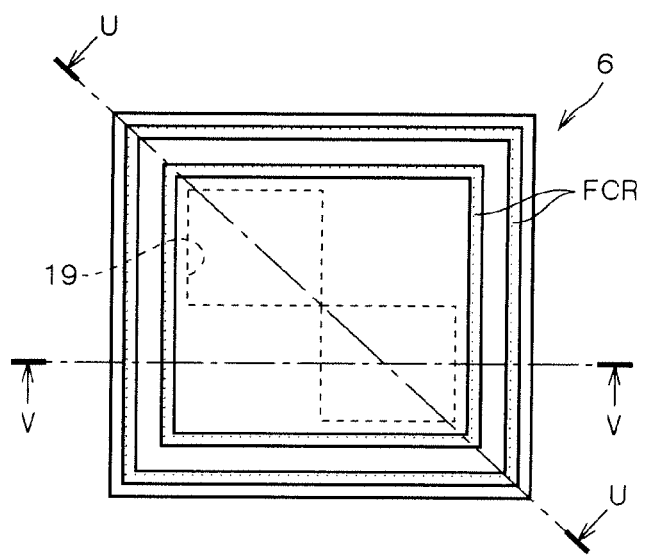
FIG. 21 is a plan view showing the structure of a semiconductor substrate having a plurality of recesses.

FIG. 21 shows the structure of a semiconductor substrate 6 having two recesses 19 in the area surrounded by filed contact rings FCR. In FIG. 21, the area other than the recesses 19 is thicker; it can be said that the cross-sectional view along U-U in FIG. 21 corresponds to the cross-sectional structure of the semiconductor substrate 3 of FIG. 11 and the cross-sectional view along line V-V corresponds to the cross-sectional structure of the semiconductor substrate 4 of FIG. 12.

FIG. 22 is a plan view showing a semiconductor wafer for obtaining semiconductor substrates having a plurality of recesses, like the semiconductor substrate 6 shown in FIG. 21. FIG. 22 shows a plurality of recesses 19 provided in each chip area on a semiconductor wafer WF3, where the plurality of recesses 19 are disposed in a matrix on one main surface of the semiconductor wafer WF3. The semiconductor wafer WF3 is diced along given dicing lines to obtain a plurality of semiconductor substrates 6.

The number of recesses formed in a semiconductor substrate is not limited to two, and recesses are not necessarily shaped the same and are not always positioned symmetrically.

For example, in plan view, the semiconductor substrate 60 shown in FIG. 23 has rectangular recesses 191 and 192 and an L-shaped recess 193. The recess 191 and recesses 192 are all rectangular but have different areas, with just a single recess 191 and a plurality of recesses 192.

A semiconductor wafer for obtaining semiconductor substrates having such recesses has a plan view where a plurality of dot-like recesses are formed densely all over one main surface of the semiconductor wafer.

J. Modifications of the Semiconductor Substrate

In the semiconductor substrates 1 to 6 described so far, the side surfaces of the recesses are vertical to the substrates' main surfaces. Therefore, the side surfaces of the recesses cannot be seen when the recesses are seen from the second main surface side.

Figure 24:
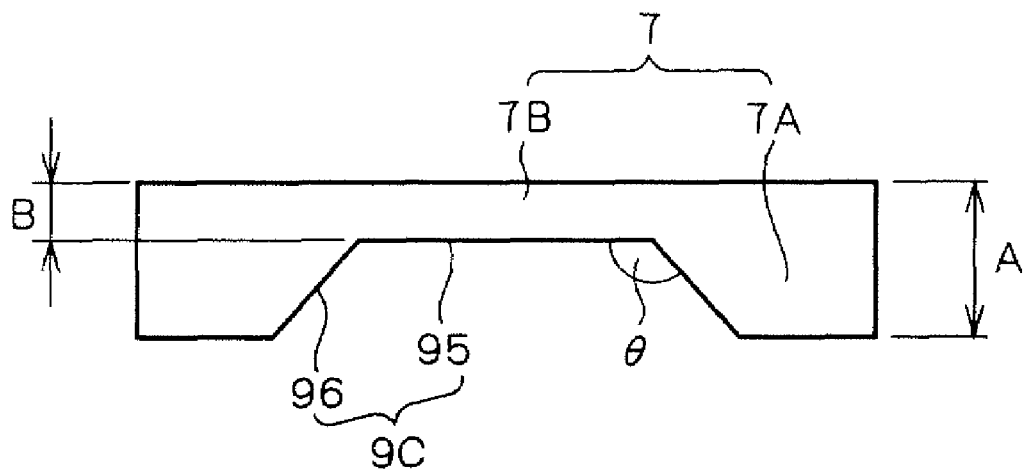
FIG. 24 is a cross-sectional view showing a modification of the structure of the semiconductor substrate for a semiconductor device of the invention.

However, as shown in FIG. 24, like the recess 9C in the semiconductor substrate 7, the side surfaces 96 of the recess 9C may be inclined to form an angle θ exceeding 90° with the substrate main surface. Then, when the recess is seen from the second main surface side, the side surfaces of the recess can be seen. The peripheral region 7A (first region) has a thickness A and the central region 7B (second region) has a thickness B.

In FIG. 24, the inclination angle that the side surfaces 96 form with the bottom surface 95 is shown as angle θ just for convenience, assuming that the bottom surface 95 is parallel to the substrate's main surface. The maximum value of the angle θ is around 175°.

When the semiconductor wafer with recesses 9C is slid during transfer, the side surfaces 96 inclined at an angle exceeding 90° prevent transfer errors and cuts of the angular portions of the recesses 9C that would otherwise occur as the angular portions are caught on some projections of the transfer system.

This also prevents accumulation of contaminants and unwanted deposits at the corners of the bottom 95 of the recess 9C.

Further, when an electrode ML is formed all over the second main surface MS2 as shown in FIG. 4, or when a semiconductor region IP1 is formed in the second main surface MS2 as shown in FIG. 5, this facilitates formation of the electrodes ML and semiconductor region IP1 on the side surfaces.

Also, this of course facilitates formation of insulating films EL on the sides as shown in FIG. 8.

K. Seventh Preferred Embodiment

Figure 25:
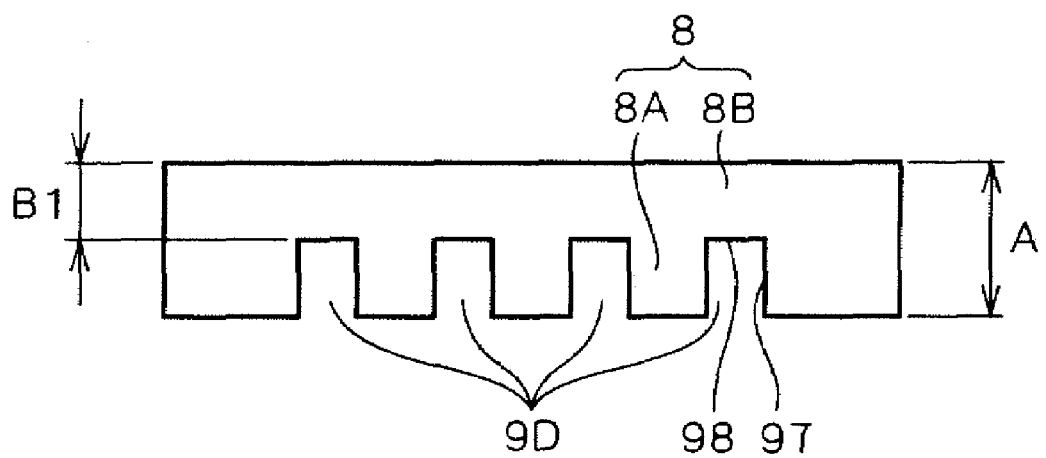
FIG. 25 is a cross-sectional view showing the structure of a semiconductor substrate used to manufacture a semiconductor device of the invention.

Like the semiconductor substrate 3 shown in FIG. 11, a semiconductor substrate having a plurality of thicknesses can be obtained by forming a plurality of recesses at different depths; likewise, as shown in FIG. 25, a plurality of recesses with the same depth may be formed so that a plurality of elements of the same kind can be fabricated.

That is to say, the semiconductor substrate 8 of FIG. 25 has a plurality of recesses 9D defined by side surfaces 97 and bottom surfaces 98 in the second main surface MS2 opposite to the first main surface MS1. It thus has recessed regions 8B (second region) having a thickness B and corresponding to the recesses 9D and the remaining mesa regions 8A (first region) having a thickness A.

FIG. 26 shows an example of plan view of the semiconductor substrate 8 seen from the second main surface side. As shown in the plan view of FIG. 26, the recesses 9D are shaped in stripes, where a plurality of stripe-shaped recesses 9D are arranged in parallel in the main surface of the semiconductor substrate 8. In FIG. 26, a cross-section cut across the plurality of recesses 9D corresponds to the sectional structure of FIG. 26.

FIG. 27 shows another example of plan view of the semiconductor substrate 8. As shown in the plan view of FIG. 27, the recesses 9D are rectangular in shape, where a plurality of rectangular recesses 9D are arranged in a matrix in the main surface of the semiconductor substrate 8.

K-1. Structure of Device

The seventh preferred embodiment of the invention now describes the structure of a semiconductor device 700 manufactured using the semiconductor substrate 8 shown in FIG. 25. It is assumed here that the semiconductor substrate 8 is shaped as shown in FIG. 26 in plan view.

Figure 28:
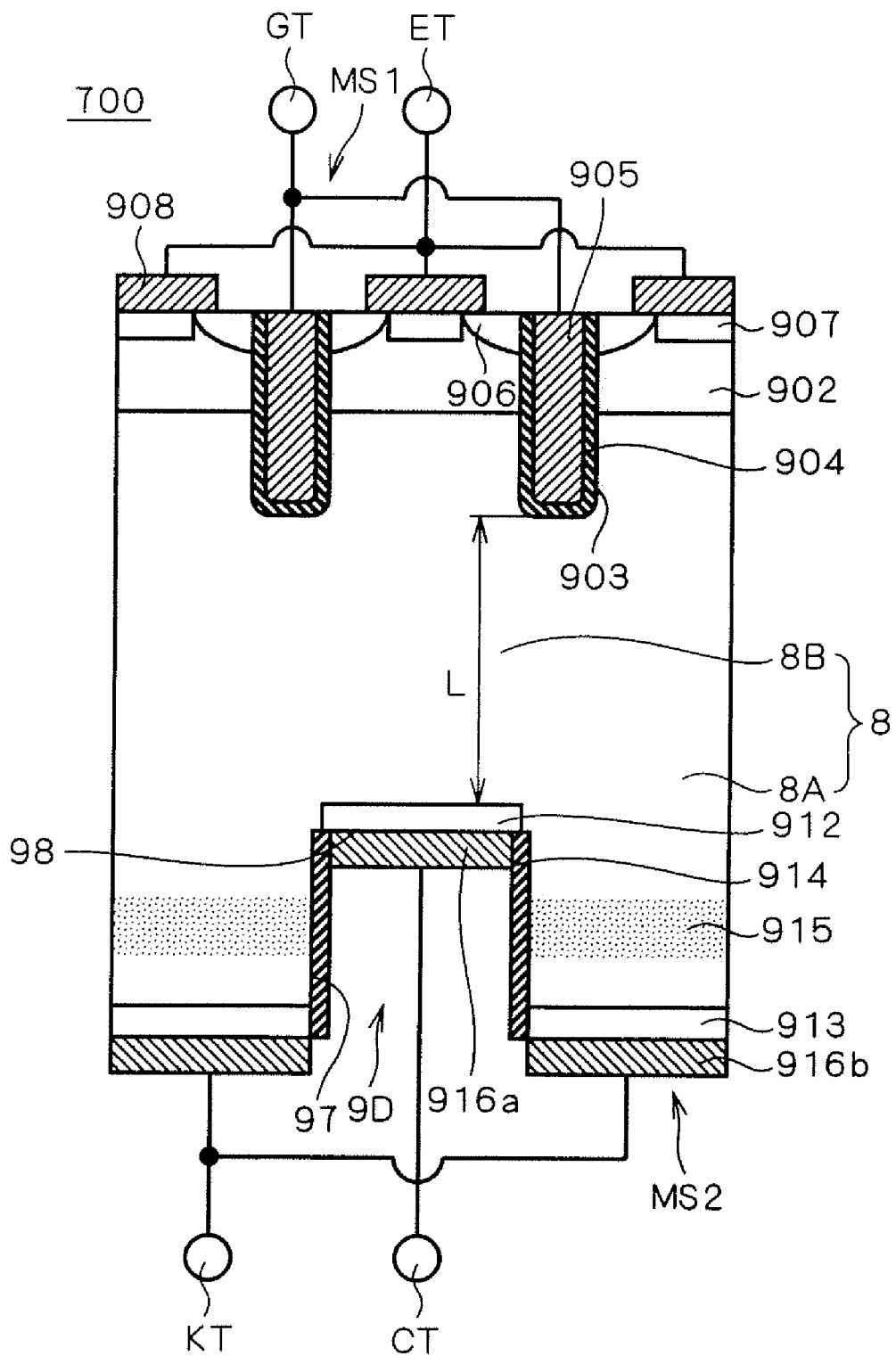
FIG. 28 is a cross-sectional view showing the structure of a semiconductor device according to a seventh preferred embodiment of the invention.

FIG. 28 shows the sectional structure of the semiconductor device 700 according to the sixth preferred embodiment of the invention. Note that the cross-section of FIG. 28 shows a semiconductor device structure that is formed with one recess 9D in the semiconductor substrate 8 of FIG. 25. It is assumed that the semiconductor substrate 8 is processed as a high-resistivity N-type substrate.

In the semiconductor device 700 of FIG. 28, a P-type semiconductor region 902 is formed in the entire first main surface MS1 of the semiconductor substrate 8.

Two trenches 903 extend from the first main surface MS1 through the P-type semiconductor region 902 to reach the inside of the semiconductor substrate 8, with their inner walls covered by gate insulating films 904. Each trench 903, covered by the gate insulating film 904, is filled with a conductor to form a gate electrode 905.

In the surface of the P-type semiconductor region 902, relatively high concentrated N-type semiconductor regions 906 are selectively formed in such a way that at least parts of them are in contact with the gate insulating films 904. With the N-type semiconductor regions 906 thus provided on both sides of the two trenches 903, relatively high concentration P-type semiconductor regions 907 are formed between opposite N-type semiconductor regions 906 between the trenches. The P-type semiconductor regions 907 are provided to obtain good electric contact with the P-type semiconductor region 902.

First main electrodes 908 are provided each in contact with top portions of adjacent N-type semiconductor regions 906 and a P-type semiconductor region 907.

The first main electrodes 908 apply potential to the N-type semiconductor regions 906 and P-type semiconductor regions 907 from an external terminal ET. Depending on operation of the semiconductor device 700, the first main electrodes 908 may function as the emitter electrode, or the anode or source electrode. Control voltage is applied to the gate electrodes 905 from an external terminal GT.

In the recess 9D in the second main surface MS2 of the semiconductor substrate 8, a P-type collector region 912 is provided in the surface of the semiconductor substrate 8 in the portion that corresponds to the bottom surface 9B.

N-type semiconductor regions 913 reside in the surface of the mesa region 8A of the second main surface MS2. Sidewall insulating films 914 are formed on the side surfaces of the recess 9D to provide electrical separation in the substrate surface between the P-type collector region 912 and the N-type semiconductor regions 913.

A second main electrode 916a and third main electrodes 916b reside in contact with the P-type collector region 912 and the N-type semiconductor regions 913.

The second main electrode 916a applies potential to the P-type collector region 912 from an external terminal CT and the third main electrodes 916b apply potential to the N-type semiconductor regions 913 from an external terminal KT. The second main electrode 916a functions as the collector electrode, and the third main electrodes 916b function as the cathode electrode or the drain electrode, depending on operation of the semiconductor device 700.

In the mesa region 8A, a lifetime control region 915 where carrier lifetime is shortened is provided close to the second main surface MS2. This region is formed by radiation of an electron beam or an ion beam such as proton or He.

The semiconductor device 700 operates as IGBT, diode, and MOSFET, depending on voltage conditions applied to the first to third main electrodes. That is to say, when the external terminal ET is at ground potential and the external terminal CT is at positive potential, then it operates as IGBT according to the signal applied to the external terminal GT.

When the external terminal ET is at ground potential, the external terminal KT is at negative potential, and the external terminal GT is supplied with an off signal, then it operates as diode.

Further, when the external terminal ET is at ground potential and the external terminal KT is at positive potential, it operates as MOSFET according to the signal applied to the external terminal GT.

In the semiconductor device 700, the P-type collector region 912 and N-type semiconductor regions 913 (cathode region) are formed at a distance so that it operates as IGBT when the external terminal CT and external terminal KT are at a same positive potential. That is to say, the distance between them (i.e. resistance value) is set so that, when a set small current flows to the cathode, the potential of the semiconductor substrate in the vicinity of the collector region is not less than the work function difference of the PN junction.

When it operates as IGBT, the first main electrodes 908 serve as the emitter electrode, the second main electrode 916a serves as the collector electrode, the N-type semiconductor regions 906 in the first main surface MS1 serve as the emitter region, the P-type semiconductor region 902 serves as the body region including channel region, and the P-type semiconductor regions 907 serve as the body contact region.

When it operates as diode, the first main electrodes 908 serve as the anode electrode, the third main electrodes 916b serve as the cathode electrode, the P-type semiconductor region 902 in the first main surface MS1 serves as the anode region, the P-type semiconductor regions 907 serve as the anode contact region, and the N-type semiconductor regions 913 in the surface of the mesa region 8A on the second main surface MS2 side serve as the cathode region.

When it operates as MOSFET, the first main electrodes 908 serve as the source electrode, the third main electrodes 916b serve as the drain electrode, the N-type semiconductor regions 906 serve as the source region, the P-type semiconductor region 902 serves as the body region including channel region, the P-type semiconductor regions 907 serve as the body contact region, and the N-type semiconductor regions 913 serve as the drain region.

K-2. Manufacturing

A method for manufacturing the semiconductor device 700 will now be described referring to the cross-sectional views of FIGS. 29 to 33 showing a sequence of process steps.

First, the semiconductor substrate 8 and a process for forming the components on the first main surface MS1 side are described referring to FIG. 28.

Since the components on the first main surface MS1 side are formed through conventionally known manufacturing steps for common IGBTs or MOSFETs, known technologies will not be explained.

As to the high-resistivity N-type semiconductor substrate 8, its resistivity and the distance L between the bottom of P-type collector region 912 and the bottom of trench 903 vary depending on the voltage class; for example, in 1200-V class, the resistivity is set at 40 to 60 Ω cm and the distance L is set at about 100 to 200 µm, and the resistivity is set lower and the distance L is set shorter in lower voltage classes.

When it operates as MOSFET and IGBT, the P-type semiconductor region 902 serves as the body region including channel region, so that its impurity concentration and depth are set on the basis of the threshold voltage of the MOSFET or IGBT.

The impurity concentration and diffusion depth are determined by ion implantation conditions and thermal diffusion conditions. For example, the impurity concentration is usually set so that it is $1\times10^{17}/cm^3$ to $1\times10^{18}/cm^3$ in the region in contact with the source electrode of MOSFET or emitter electrode of IGBT and the diffusion depth is set at several µm so that it does not extend over the trenches 903.

The trenches 903 are provided by etching at a pitch of 2 to 10 µm, with their width at 0.5 to 3.0 µm and depth at 3 to 20 µm.

The gate insulating film 904 on the inner surfaces of the trenches 903 is an insulating film forming MOSFET, whose thickness is optimized on the basis of the gate driving voltage, saturation current, capacitance, etc. In general, a silicon oxide film having a thickness of 10 to 200 nm is formed by thermal oxidation or deposition, for example.

The gate electrodes 905 buried in the trenches 903 are formed of a high-impurity-concentration polycrystalline silicon film, a refractory metal material like tungsten silicide, or a multi-layered film thereof. In general, they are obtained by depositing, on the first main surface MS1, a conductive film to a thickness not less than half the width of the trenches 903 and planarizing it by, e.g. anisotropic etching; they may be obtained by forming a mask with given pattern through photolithography, depositing a conductive film, and etching it.

The optimum concentration for the P-type semiconductor region 902 varies depending on the work function of the material of the gate electrodes 905; in extreme cases, a buried channel structure may be adopted in which N-type semiconductor regions are formed along the sides of the trenches 903 and a thin layer of the same conductivity type (N type) as the emitter region is formed in regions in contact with the gate insulating films.

The N-type semiconductor regions 906 and P-type semiconductor regions 907 are both formed by patterning with photolithography and ion implantation, whose surface concentration is set at $1 \times 10^{20}/cm^3$ or more.

The first main electrodes 908 are made by forming an interlayer insulating film (not shown) covering the N-type semiconductor regions 906 and P-type semiconductor regions 907, selectively forming openings by photolithography and etching, and depositing a conductive film of a compound of aluminum and silicon, for example.

A protective film (not shown) is formed on the first main electrodes 908 and connection to an external power supply is made through openings in given areas of the protective film.

Next, a process for forming the components on the second main surface MS2 side is described referring to FIGS. 29 to 33. In the description below, it is assumed that, the components on the first main surface MS1 side that underlie the first main electrodes 908 have already been completed.

Figure 29:
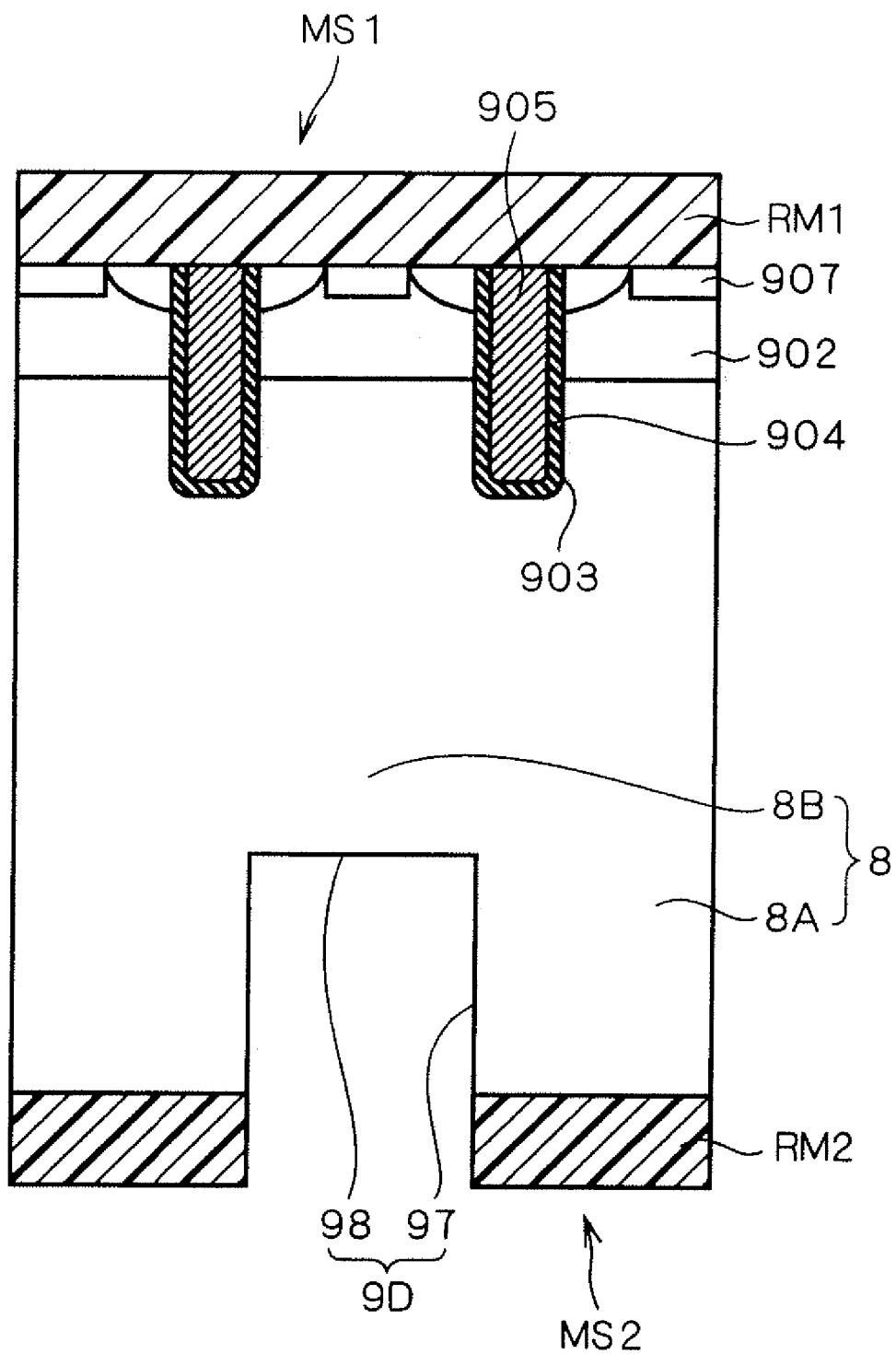
FIG. 29 is a cross-sectional view showing a process step for manufacturing the semiconductor device of the seventh preferred embodiment of the invention.

First, in the step shown in FIG. 29, after the formation of the components under the first main electrodes 908 on the first main surface MS1 side, the first main surface MS1 is covered with a resist mask RM1.

Then a resist mask RM2 having an opening for the formation of recess 9D is formed on the second main surface MS2 and the semiconductor substrate 8 is etched by anisotropic etching using that resist mask RM2 to form the recess 9D.

The depth of the recess 9D is optimized according to the voltage class of the semiconductor device 700, the final thickness of the semiconductor substrate 8, cost, etc. In a range that cost permits, the distance L (see FIG. 28) between the P-type collector region 912 and the bottom of trench 903 is set at 100 to 200 µm in 1200-V class, as mentioned earlier; the distance L is set shorter in lower voltage classes.

The minimum value of the depth of the recess 9D is set so that IGBT operates when the same potential is applied to the P-type collector region 912 as the IGBT collector and the drain regions 913 (see FIG. 28) as MOSFET and a voltage is applied to the gate electrodes 905 such that a channel turns ON.

The depth of the recess 9D is thus determined on the basis of the resistivity of the mesa region 8A of the semiconductor substrate 8, the impurity concentration of the P-type collector region 912, the area ratio between the P-type collector region 912 and N-type semiconductor regions 913, the rated current density, the allowable range of the relation between voltage and current when MOSFET operation changes to IGBT operation, i.e. the allowable range for snap back, and so forth.

The width and pitch of the recesses 9D can be set arbitrarily; the width is typically 0.2 to 100 µm, which is set so that imbalance will not occur in the area ratio between the P-type collector region 912 and the N-type semiconductor regions 913, as mentioned earlier.

The formation of the recess 9D may be performed at other stages than that mentioned above; however, it is desirable to form it before formation of the first main electrodes 908, when metal contamination by electrode material, generally heavy metal, is taken into consideration.

Figure 30:
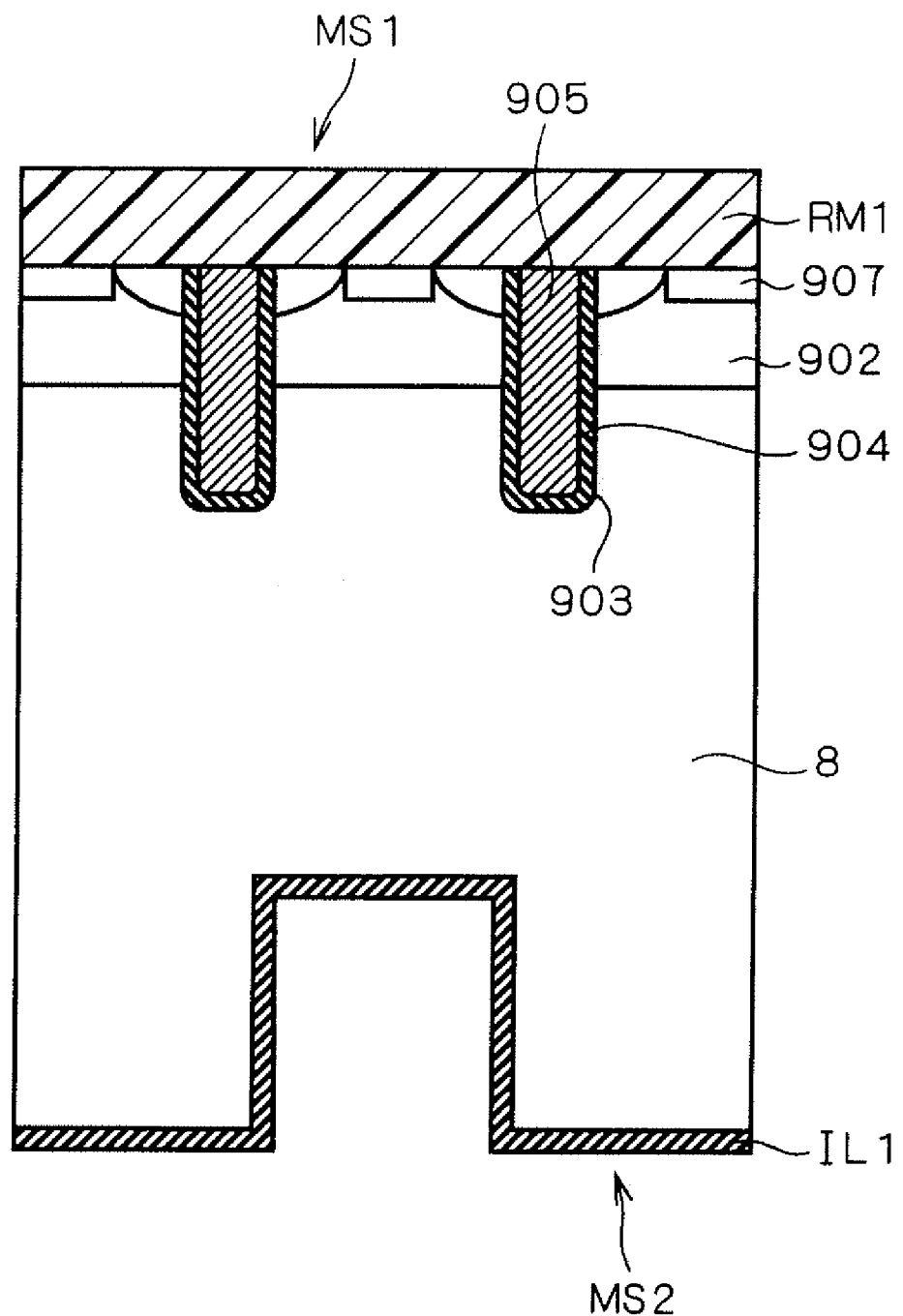
FIG. 30 is a cross-sectional view showing a process step for manufacturing the semiconductor device of the seventh preferred embodiment of the invention.

Next, after removal of the resist mask RM2, in the process step shown in FIG. 30, an insulating film IL1 is formed all over the second main surface. The insulating film IL1 is formed by selective oxidation or deposition.

Figure 31:
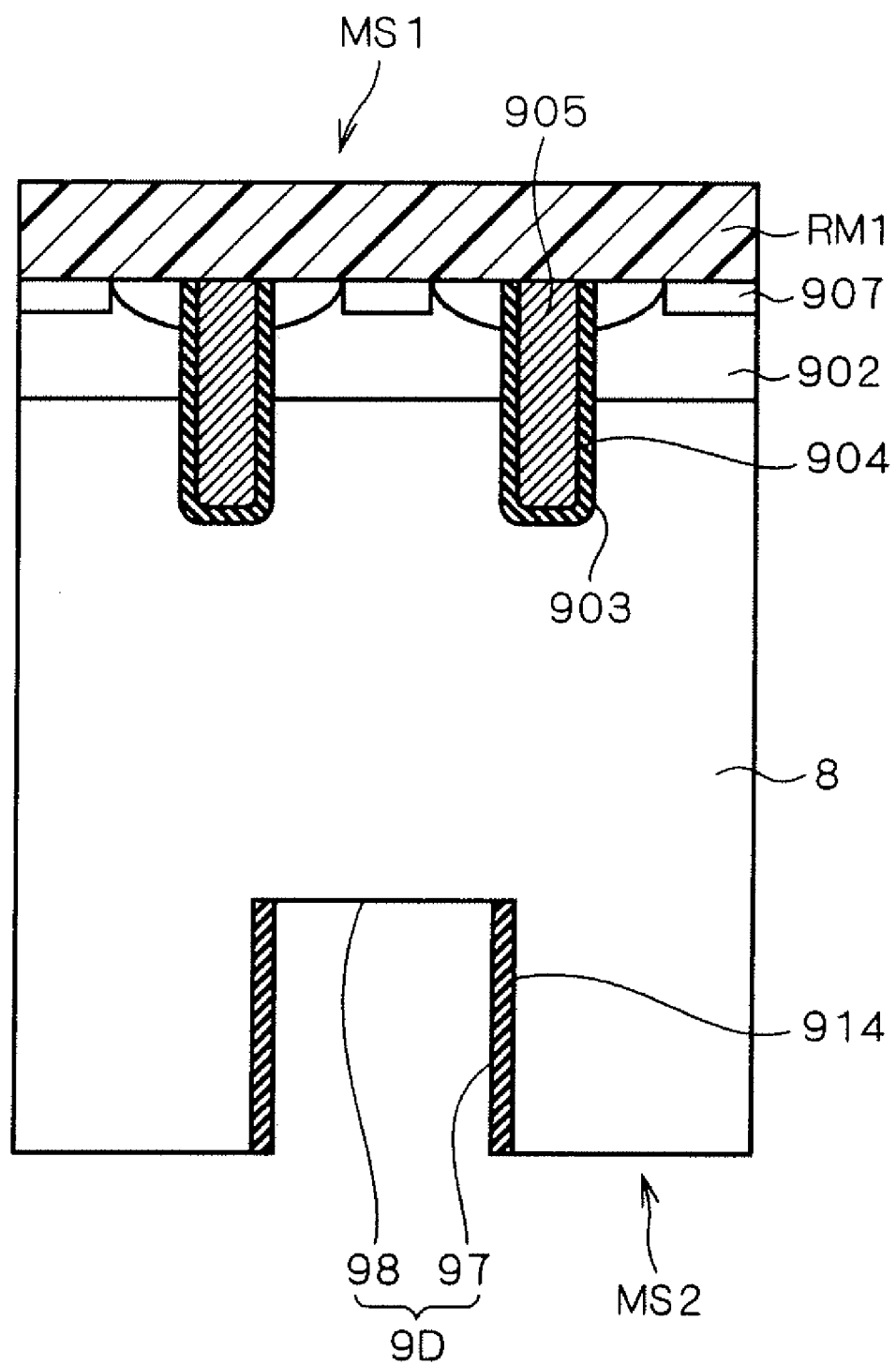
FIG. 31 is a cross-sectional view showing a process step for manufacturing the semiconductor device of the seventh preferred embodiment of the invention.

Then, in the process step shown in FIG. 31, an anisotropic etching process is applied so that it remains as sidewall insulating films 914 only on the side surfaces 97 of the recess 9D.

The sidewall insulating films 914 can be formed either before or after the formation of the P-type collector region 912 and the N-type semiconductor regions 913; however, it is desirable to form the sidewall insulating films 914 before formation of the N-type semiconductor regions 913 and P-type collector region 912 because several percent to several tens of percent of the impurities for their formation may be introduced into the regions corresponding to the side surfaces 97 of the recess 9D.

Figure 32:
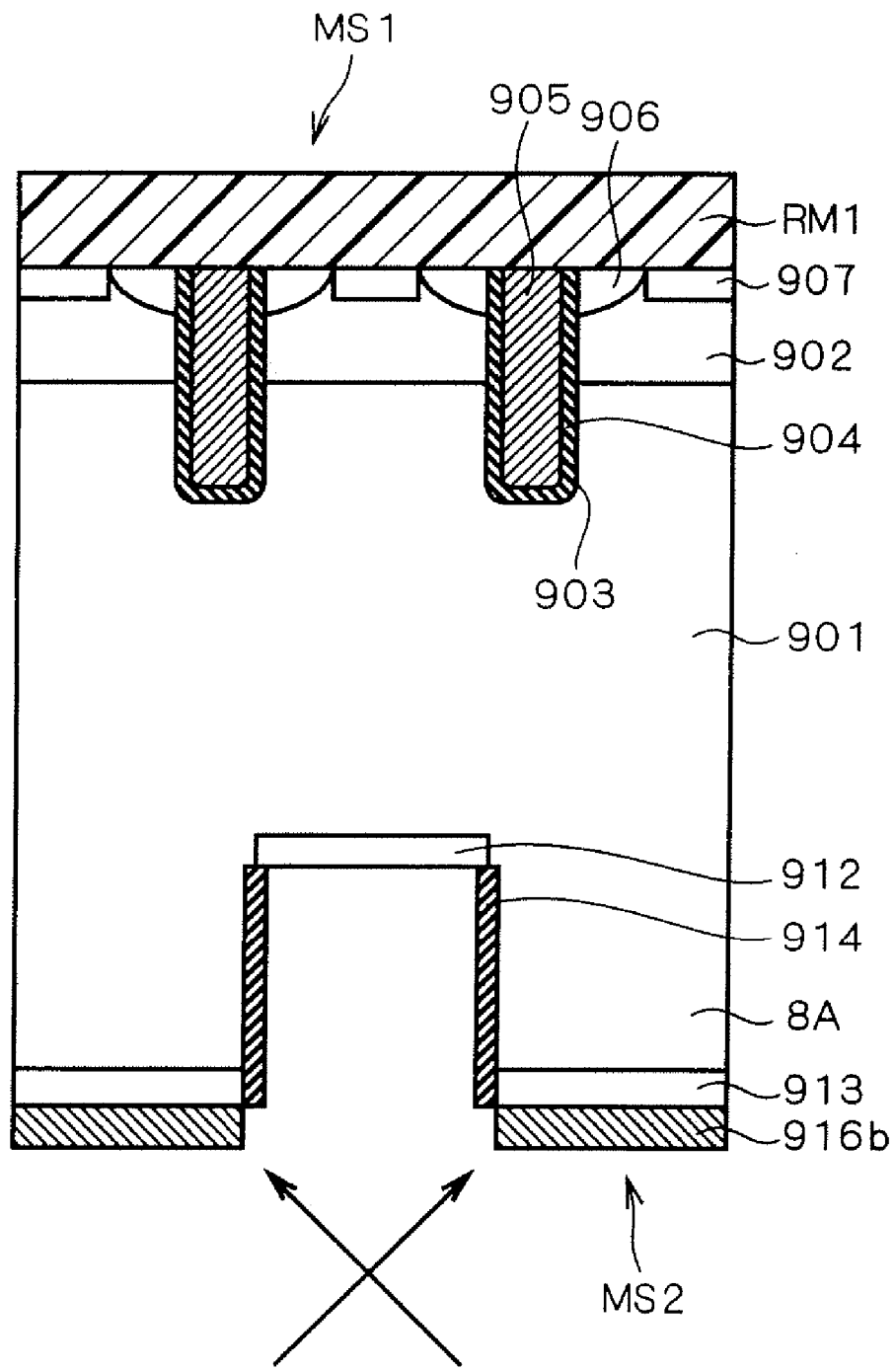
FIG. 32 is a cross-sectional view showing a process step for manufacturing the semiconductor device of the seventh preferred embodiment of the invention.

Next, after formation of the N-type semiconductor regions 913 by ion implantation into the surface of the mesa region 8A on the second main surface MS2 side, in the process step shown in FIG. 32, a resist mask RM3 having an opening corresponding to the recess 9D is formed on the second main surface MS2. Then the P-type collector region 912 is formed by ion implantation into the surface of the semiconductor substrate 8 in the bottom surface 98 of the recess 9D. The ion implantation for formation of the P-type collector region 912 preferably adopts an inclined rotational ion implantation process in which ions are implanted in an inclined direction, with the substrate inclined and rotated.

The impurity concentrations of the P-type collector region 912 and the N-type semiconductor regions 913 are both set in the range of $1 \times 10^{16}$ to $1 \times 10^{21}/cm^3$. Basically, either of them may be formed first, but it is desirable to form the P-type collector region 912 first, as will be explained later.

Figure 33:
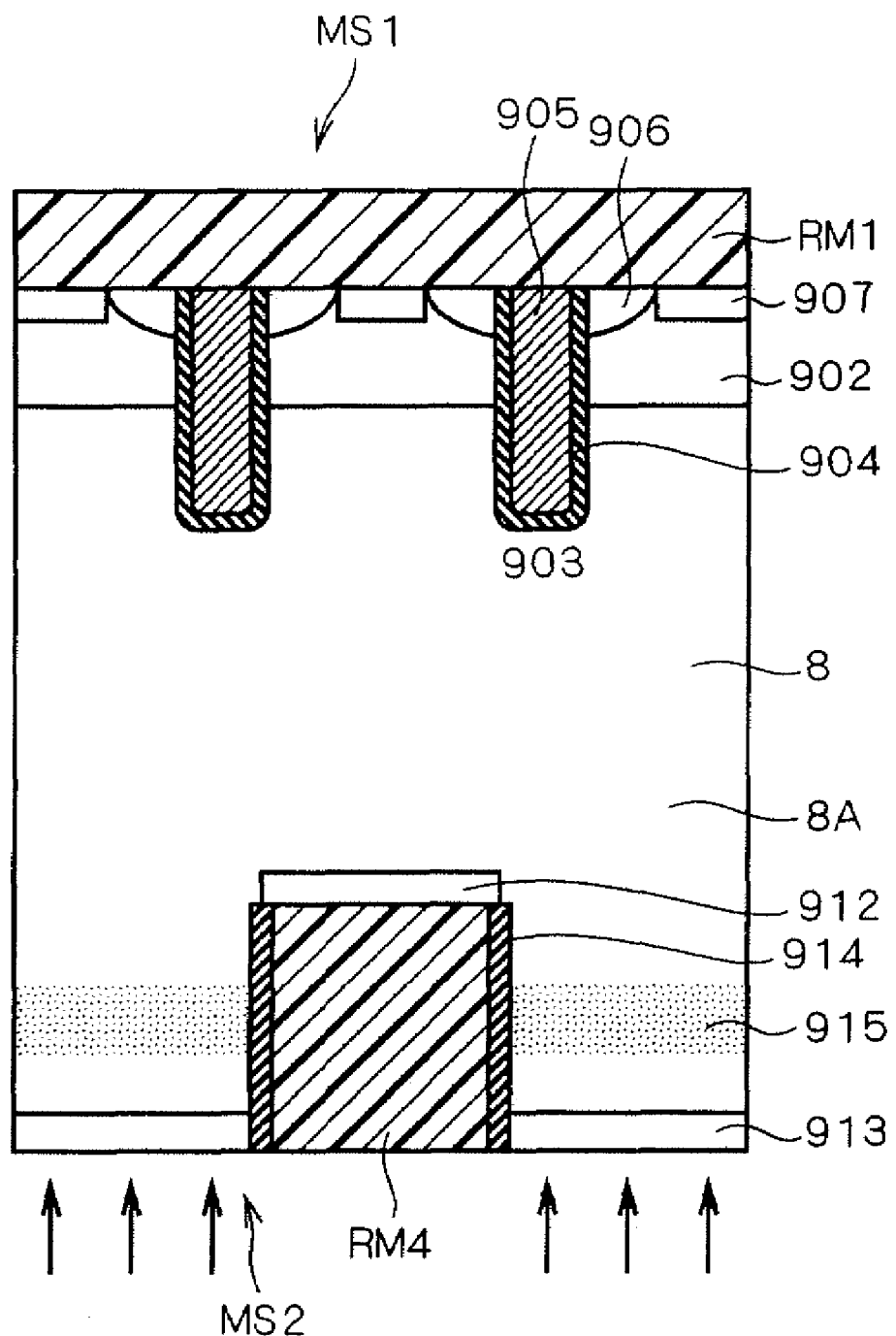
FIG. 33 is a cross-sectional view showing a process step for manufacturing the semiconductor device of the seventh preferred embodiment of the invention.

Next, after removal of the resist mask RM3, in the process step shown in FIG. 33, the recess 9D is covered with a resist mask RM4 and then an electron beam or proton or He ions, for example, are applied from the second main surface MS2 side to form a crystal defect region in a portion of the mesa region 8A close to the second main surface MS2, thus forming the lifetime control region 915 with shortened carrier lifetime.

The formation of the lifetime control region 915 may be performed at other stages than that mentioned above, but it is desirably formed after annealing of the P-type collector region 912 and the N-type semiconductor regions 913, because a lesser degree of activation by annealing suffices for the lifetime control region 915 than for the activation of the P-type collector region 912 and N-type semiconductor regions 913.

When the semiconductor device 700 operates as diode, the lifetime control region 915 suppresses carrier amplification rate and enhances recovery characteristic.

Subsequently, after removal of the resist masks RM1 and RM4, the first main electrodes 908 are formed on the first main surface MS1 and the second main electrode 916a and third main electrodes 916b are formed on the second main surface, thus completing the semiconductor device 700.

In order to prevent metal contamination, it is desirable to form the second main electrode 916a and third main electrodes 916b in the final step of the wafer process because they are made of a multi-layered metal film containing gold or silver.

Figure 34:
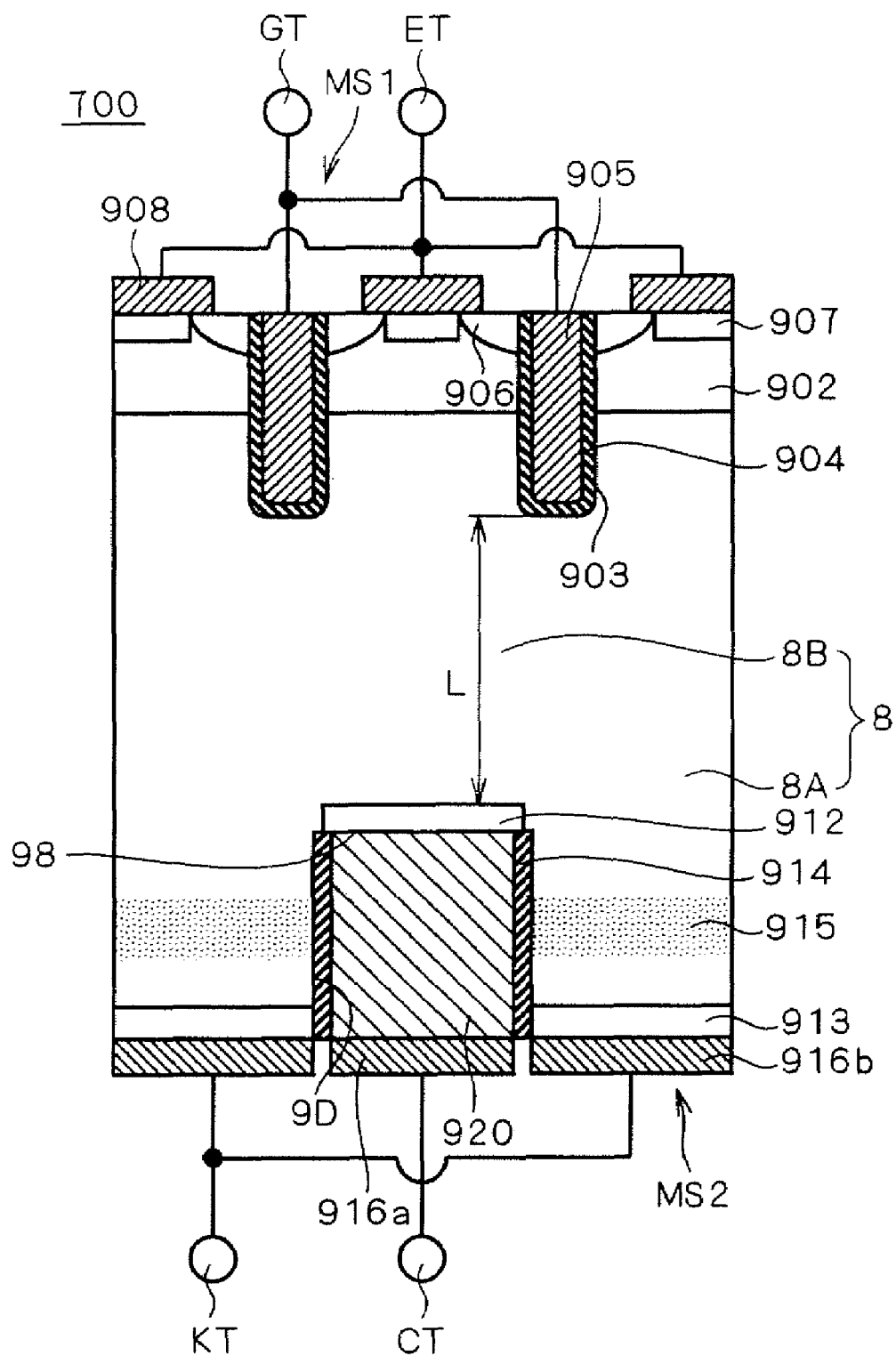
FIG. 34 is a cross-sectional view showing a more specific structure of the semiconductor device of the seventh preferred embodiment of the invention.

The semiconductor device 700 of FIG. 28 has shown a structure in which the second main electrode 916a resides at the bottom 98 of the recess 9D in direct contact with the P-type collector region 912 and is connected to the external terminal CT; however, in practice, as shown in FIG. 34, for example, the recess 9D is filled with a conductor layer 920 and the second main electrode 916*a* is formed not at the bottom 98 of the recess 9D but on the surface of the conductor layer 920. This structure facilitates connection with the external terminal CT and filling the recess 9D with the conductor layer 920 increases the mechanical strength of the semiconductor substrate 8, which facilitates handling of the semiconductor substrate 8 during the semiconductor device manufacturing process.

The conductor layer 920, which is a refractory metal layer such as tungsten (W) or titanium (Ti), is buried in the recess 9D after the formation of the P-type collector region 912 described referring to FIG. 32. It is desirable to fill the recess 9D in an earlier stage of the manufacturing process; forming the N-type semiconductor regions 913 and the lifetime control region 915 after the recess 9D has been filled means that the ion implantation processes are applied to mechanically strengthened semiconductor substrate 8, which facilitates handling, e.g. transfer, of the semiconductor substrate 8.

Figure 35:
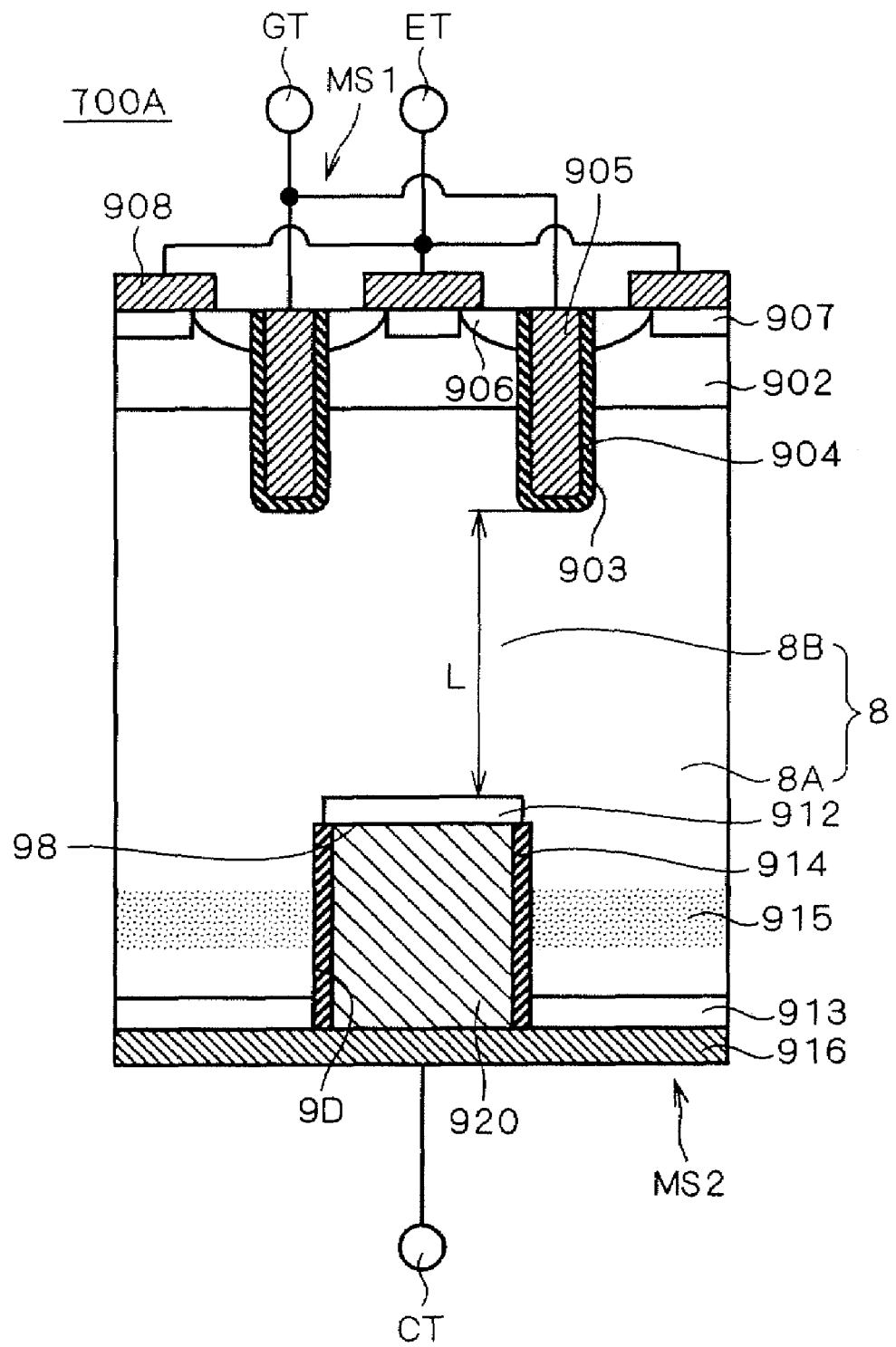
FIG. 35 is a cross-sectional view showing a more limited application of the semiconductor device of the seventh preferred embodiment of the invention.

Also, the semiconductor device 700 of FIG. 28 has shown the second main electrode 916*a* and third main electrodes 916*b* as independent electrodes; however, as shown in FIG. 35 as a semiconductor device 700A, the recess 9D may be filled with conductor layer 920 with a common main electrode 916 lying over both of the surfaces of the N-type semiconductor regions 913 and the surface of the conductor layer 920. The common main electrode 916 is connected to the external terminal CT.

With this structure, when a same positive potential is applied to the N-type semiconductor regions 913 and P-type collector region 912, the semiconductor device 700A can operate as IGBT since the P-type collector region 912 and the N-type semiconductor regions 913 (cathode region) are separated at a distance.

When the semiconductor device 700A operates as IGBT, the first main electrodes 908 serve as the emitter electrode, the common main electrode 916 serves as the collector electrode, the N-type semiconductor regions 906 in the first main surface MS1 serve as the emitter region, the P-type semiconductor region 902 serves as the body region including channel region, and the P-type semiconductor regions 907 serve as the body contact region.

Also, it operates as diode when the external terminal ET is at ground potential, the common main electrode 916 is at negative potential, and the external terminal GT is supplied with an off signal.

In this case, the first main electrodes 908 serve as the anode electrode, the common main electrode 916 serves as the cathode electrode, the P-type semiconductor region 902 in the first main surface MS1 serves as the anode region, the P-type semiconductor regions 907 serve as the anode contact region, and the N-type semiconductor regions 913 in the surface of the mesa region 8A on the second main surface MS2 side serve as the cathode region.

In the semiconductor device 700A, only the common main electrode 916 is formed on the second main surface MS2, which simplifies the manufacturing process as compared with a process in which a plurality of main electrode patterns are formed on the second main surface MS2 side.

L. First Modification

Figure 36:
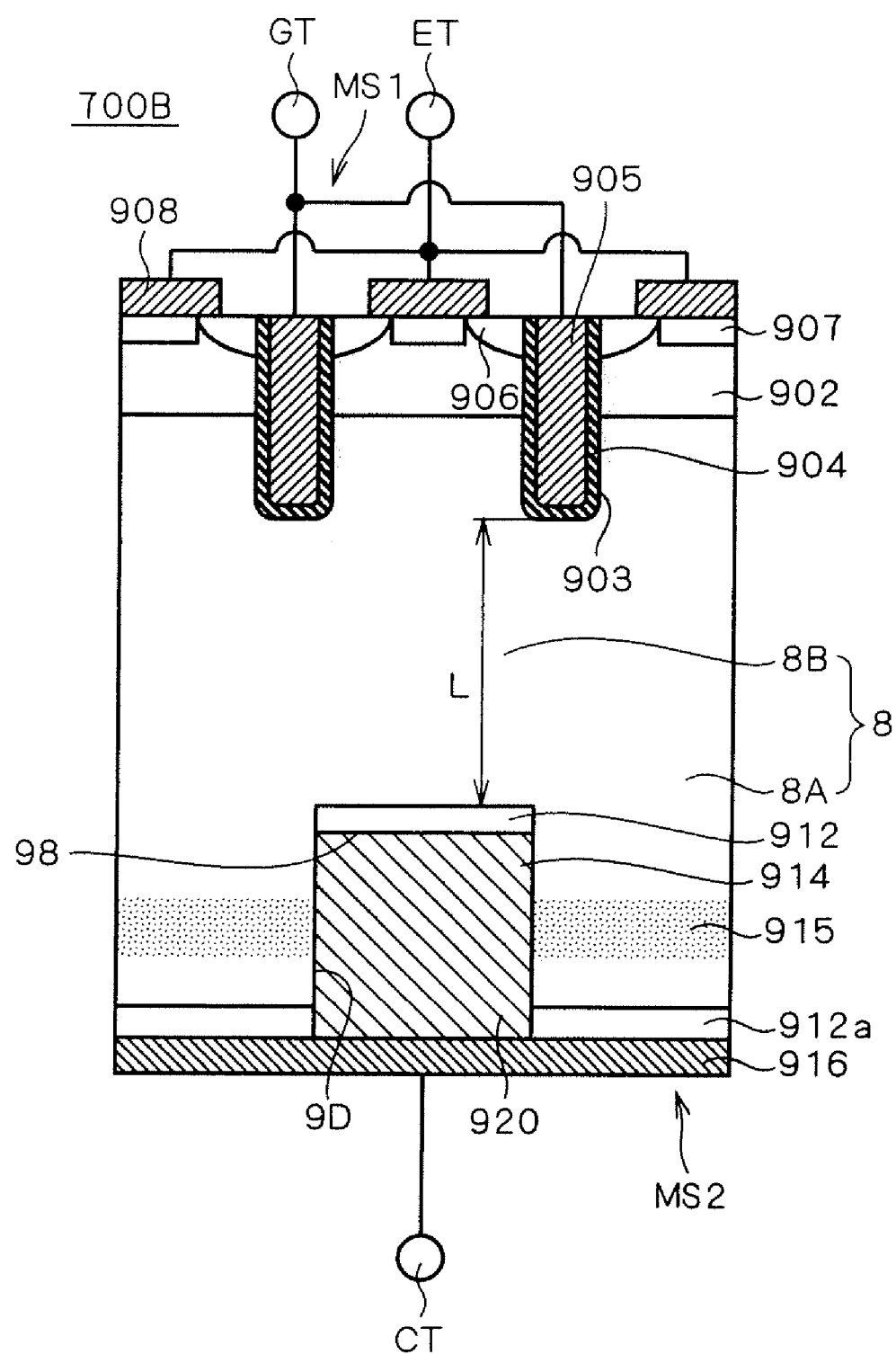
FIG. 36 is a cross-sectional view showing the structure of a first modification of the semiconductor device of the seventh preferred embodiment of the invention.

The semiconductor devices 700 and 700A of the seventh preferred embodiment have shown structures in which the N-type semiconductor regions 913 are provided in the surface of the mesa region 8A on the second main surface MS2 side; however, as shown in FIG. 36 as a semiconductor device 700B, P-type semiconductor regions 912*a* may replace the N-type semiconductor regions 913.

This structure does not need electrical separation between the P-type collector region 912 and the P-type semiconductor regions 912*a*, which removes the need for sidewall insulating films on the side surfaces of the recess 9D.

The semiconductor device 700B has a recess 9D filled with a conductor layer 920 with a common main electrode 916 lying over the surfaces of both of the P-type semiconductor regions 912*a* and the conductor layer 920. The common main electrode 916 is connected to the external terminal CT.

With this structure, when a same positive potential is applied to the P-type collector region 912 and P-type semiconductor regions 912*a*, the semiconductor device 700B can operate as IGBT.

That is to say, when the semiconductor device 700B operates as IGBT, the first main electrodes 908 serve as the emitter electrode, the common main electrode 916 serves as the collector electrode, the N-type semiconductor regions 906 in the first main surface MS 1 serve as the emitter region, the P-type semiconductor region 902 serves as the body region including channel region, and the P-type semiconductor regions 907 serve as the body contact region.

In the semiconductor device 700B, as stated above, no sidewall insulating films reside on the sides of the recess 9D and the conductor layer 920 buried in the recess 9D is in contact with the N-type semiconductor substrate 8 in the portions defining the sides of the recess 9D; therefore, during IGBT operation, electrons can easily flow to the external terminal CT through the conductor layer 920 to enable high-speed operation.

M. Second Modification

Figure 37:
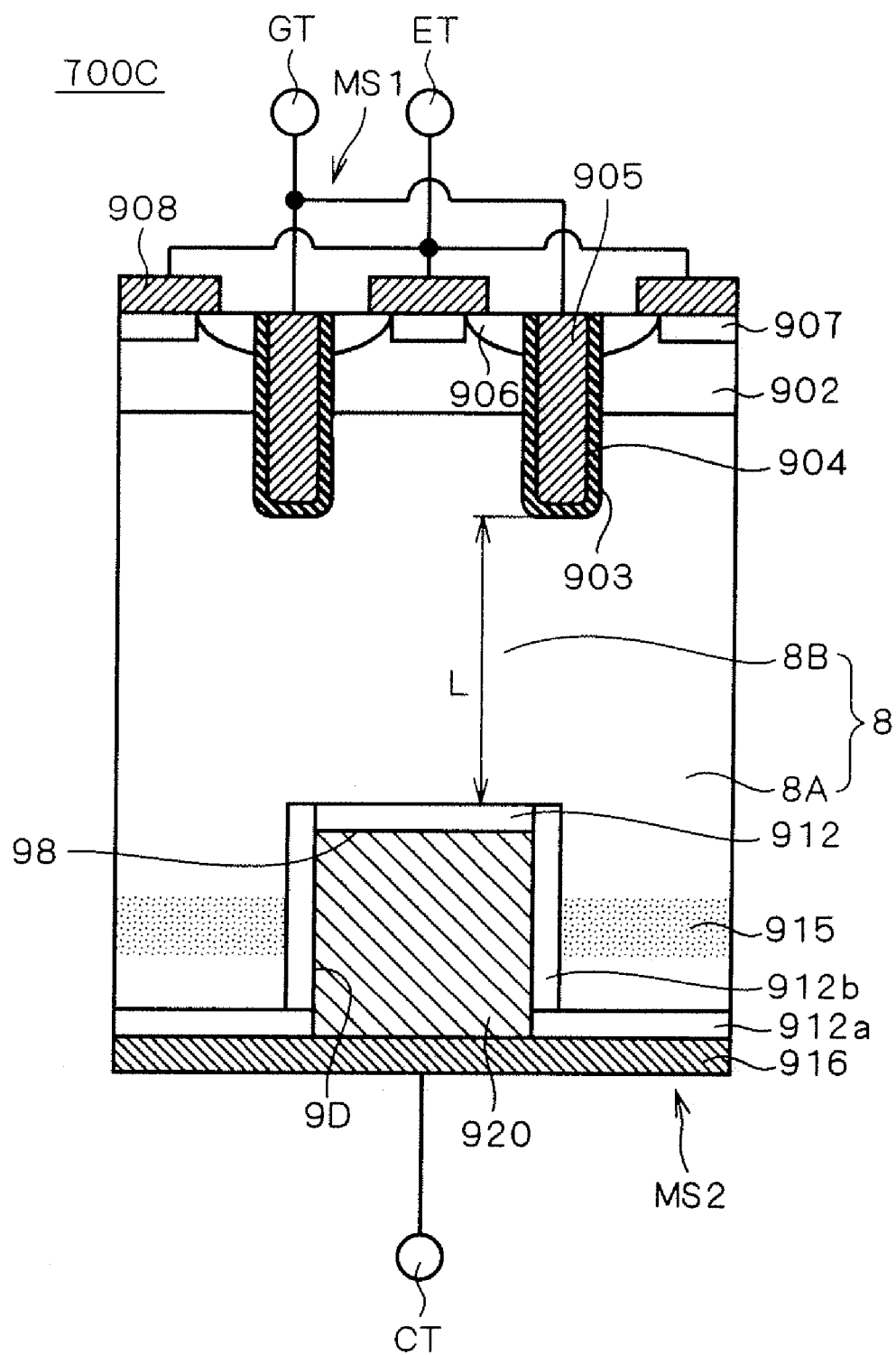
FIG. 37 is a cross-sectional view showing the structure of a second modification of the semiconductor device of the seventh preferred embodiment of the invention.

In the semiconductor devices 700 and 700A of the seventh preferred embodiment, N-type semiconductor regions 913 are provided in the surface of the mesa region 8A on the second main surface MS2 side; however, as shown in FIG. 37 as a semiconductor device 700C, P-type semiconductor regions 912*a* may replace the N-type semiconductor regions 913, with P-type semiconductor regions 912*b* formed in the surface of the N-type semiconductor substrate 8 in the portions defining the sides of the recess 9D, where the P-type collector region 912 and the P-type semiconductor regions 912*a* are thus electrically connected through the P-type semiconductor regions 912*b*.

Also in the semiconductor device 700C, the recess 9D is filled with a conductive layer 920 and a common main electrode 916 is disposed over the surfaces of the P-type semiconductor regions 912*a* and the conductor layer 920. The common main electrode 916 is connected to the external terminal CT.

With this structure, when a same positive potential is applied to the P-type collector region 912 and P-type semiconductor regions 912*a*, the semiconductor device 700C can operate as IGBT.

That is, when the semiconductor device 700C operates as IGBT, the first main electrodes 908 serve as the emitter electrode, the common main electrode 916 serves as the collector electrode, the N-type semiconductor regions 906 in the first main surface MS 1 serve as the emitter region, the P-type semiconductor region 902 serves as the body region including channel region, and the P-type semiconductor regions 907 serve as the body contact region.

As stated above, in the semiconductor device 700C, the P-type semiconductor regions 912*b* reside in the surface of the N-type semiconductor substrate 8 in the portions defining the sides of the recess 9D and the recess 9D is filled with the conductor layer 920; therefore, during IGBT operation, holes can easily flow into the semiconductor device 700C from the external terminal CT through the P-type semiconductor regions 912b, which enables high-speed operation.

Furthermore, the existence of the P-type collector region 912, P-type semiconductor regions 912a and P-type semiconductor regions 912b offers an increased area of P-type impurity region, which increases current during IGBT operation and reduces the on-state voltage.

The P-type semiconductor regions 912b can be formed without complicating the manufacturing process, by utilizing the inclined rotational ion implantation process that is performed to form the P-type collector region 912 in the surface of the semiconductor substrate 8 in the portion corresponding to the bottom 98 of the recess 9D. In this case, the P-type semiconductor regions 912b can be formed by further inclining the substrate than it is inclined for the formation of the P-type collector region 912.

N. Examples of Application

While the semiconductor device 700 described as the seventh preferred embodiment has common trench-type elements on the first main surface MS1 side, modified structures of trench-type elements may be adopted on the first main surface MS1 side, or planar-type elements may be adopted. Thyristor structure may also be adopted in place of the transistor structure.

While it is assumed in the semiconductor device 700 that the semiconductor substrate 8 is of N type, it can of course be P type.

The semiconductor device 700 has the P-type collector region 912 at the bottom of the recess 9D; however, the P-type collector region may be removed if the bottom surface of the recess 9D substantially functions as a P-type region without the need for introduction of P-type impurities, depending on the crystalline roughness of the bottom surface of the recess 9D, for example.

As to the roughness of the bottom surface, a rougher surface offers more P-type characteristics, and even when P-type impurities are introduced, the rougher the recess's bottom surface becomes, the smaller the carrier emission energy at the acute corners becomes, which facilitates hole injection and reduces on-state voltage.

The on-state voltage reduction effect provided by roughening the surface of the P-type collector region can be applied also to so-called NPT (non-punch-through) type IGBTs in which no recess exists in the second main surface MS2 of the semiconductor substrate 8 and the depth of the P-type collector region is 2.0 μm or less.

Also, while the semiconductor device 700 has shown the second main electrode 916a and the third main electrodes 916b connected respectively to the external terminal CT and the external terminal KT, the second main electrode 916a and the third main electrodes 916b may be connected through the sidewall insulating films 914.

Furthermore, while the semiconductor device 700 has lifetime control region 915 for suppressing recovery as diode, it can be removed depending on specifications of the semiconductor device 700.

On the other hand, depending on the impurity concentration of the P-type collector region 912, it may be desirable to form a lifetime control region 915 also in a portion closer to the first main surface MS1 than the P-type collector region 912. Or a lifetime control region may be formed substantially in the entirety of the semiconductor substrate 8.

While the invention has been described in detail, the foregoing description is in all aspects illustrative and not restrictive. It is understood that numerous other modifications and variations can be devised without departing from the scope of the invention.

What is claimed is:

1. A semiconductor device comprising:
   a semiconductor substrate;
   a first main electrode provided on a first main surface of said semiconductor substrate; a second main electrode provided on a second main surface of said semiconductor substrate, wherein a main current flows in a thickness direction of said semiconductor substrate;
   a trench that extends from the first main surface of said semiconductor substrate towards the second main surface;
   a gate insulating film covering an inner surface of said trench;
   a gate electrode buried in said trench and surrounded by said gate insulating film,
   wherein said semiconductor substrate has at least one recess formed in said second main surface and therefore said semiconductor substrate at least has a first region having a first thickness and a second region having a second thickness that is thinner than said first thickness,
   said second region corresponds to a region where said at least one recess is formed,
   said second main electrode is provided in said at least one recess, and
   said second thickness is set at such a thickness as to keep a breakdown voltage of said semiconductor device; and
   a semiconductor region provided in a surface of said semiconductor substrate in a bottom of said at least one recess and directly contacting the second main electrode, said semiconductor region having a higher impurity concentration than said semiconductor substrate,
   wherein said semiconductor region has a conductivity type opposite to that of said semiconductor substrate.

2. The semiconductor device according to claim 1, wherein said recess is located substantially in a center of said semiconductor device.

3. The semiconductor device according to claim 1, further comprising an insulating film provided in a surface of said semiconductor substrate in a portion corresponding to a side of said at least one recess.

4. The semiconductor device according to claim 1,
   wherein said semiconductor substrate has a first conductivity type,
   and wherein said semiconductor device further comprises:
   a first semiconductor region having a second conductivity type and provided in the entirety of said first main surface of said semiconductor substrate;
   a second semiconductor region having said first conductivity type and selectively provided in a surface of said first semiconductor region, a portion of said second semiconductor region being in contact with said gate insulating film;
   a third semiconductor region having said second conductivity type and provided in a surface of said semiconductor substrate in a portion corresponding to a bottom of said at least one recess;
   a fourth semiconductor region having the first conductivity type and provided in a surface of said first region on said second main surface side; and a third main electrode in contact with said fourth semiconductor region, and wherein said trench is formed to extend from said first main surface and pass through said first semiconductor region;

said third semiconductor region corresponds to said semiconductor region, said first main electrode is in contact with said second semiconductor region, said second main electrode is electrically connected to said third semiconductor region, and said third semiconductor region and said fourth semiconductor region are provided to be apart from each other.

5. The semiconductor device according to claim 4, further comprising a lifetime control region where carrier lifetime is shortened, said lifetime control region being provided in said first region and closer to said second main surface than said third semiconductor region.

6. The semiconductor device according to claim 4, further comprising an insulating film provided on the surface of said semiconductor substrate in a portion corresponding to a side of said recess.

7. The semiconductor device according to claim 4, wherein said recess has such a depth that a distance between a bottom of said third semiconductor region and a bottom of said trench is 100 to 200 μm.

8. The semiconductor device according to claim 4, wherein said recess has a width in the range of 0.2 to 100 μm.

9. The semiconductor device according to claim 1, wherein said first thickness is set in the range of 500 to 650 μm and said second thickness is set at around 60 μm.

10. The semiconductor device of claim 1, further comprising a lifetime control region where carrier lifetime is shortened, said lifetime control region being provided in said first region and closer to said second main surface than said semiconductor region.

* * * * *